(12) United States Patent
Yean et al.

(10) Patent No.: US 8,399,297 B2
(45) Date of Patent: Mar. 19, 2013

(54) METHODS OF FORMING AND ASSEMBLING PRE-ENCAPSULATED ASSEMBLIES AND OF FORMING ASSOCIATED SEMICONDUCTOR DEVICE PACKAGES

(75) Inventors: Tay Wuu Yean, Singapore (SG); Wang Ai-Chie, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/277,988

(22) Filed: Oct. 20, 2011

(65) Prior Publication Data

US 2012/0034740 A1 Feb. 9, 2012

Related U.S. Application Data

(62) Division of application No. 12/128,575, filed on May 28, 2008, now Pat. No. 8,072,082.

(30) Foreign Application Priority Data

Apr. 24, 2008 (SG) ............................... 200803157-7

(51) Int. Cl.
*H01L 21/00* (2006.01)
(52) U.S. Cl. . 438/107; 438/117; 438/125; 257/E25.017; 257/690
(58) Field of Classification Search ........... 257/E25.017, 257/E21.614, E21.502, 685, 686, 690, 698, 257/723, 777; 438/64, 107–109, 117, 125; 427/58; 361/760
See application file for complete search history.

(56) References Cited

U.S. PATENT DOCUMENTS

| | | | |
|---|---|---|---|
| 3,370,203 A | 2/1968 | Kravitz et al. | |
| 3,904,934 A | 9/1975 | Martin | |
| 4,143,456 A | 3/1979 | Inoue | |
| 4,264,917 A | 4/1981 | Ugon | |
| 4,300,153 A | 11/1981 | Hayakawa et al. | |
| 4,323,914 A | 4/1982 | Berndlmaier et al. | |
| 4,358,552 A | 11/1982 | Shinohara et al. | |
| 4,507,675 A | 3/1985 | Fujii et al. | |
| 4,642,671 A | 2/1987 | Rohsler et al. | |
| 4,801,998 A | 1/1989 | Okuaki | |
| 4,835,120 A | 5/1989 | Mallik et al. | |
| 4,862,245 A | 8/1989 | Pashby et al. | |

(Continued)

FOREIGN PATENT DOCUMENTS

| JP | 5277684 | 6/1977 |
|---|---|---|
| JP | 55128835 | 10/1980 |

(Continued)

OTHER PUBLICATIONS

Ammann et al, Multichip Packaging in QFPs by PBO-Multilayer High Density Interconnect, 1998 International Conference on Multichip Modules and High Density Packaging, Publication Date, Apr. 15-17, 1998, pp. 29-34.

Imoto et al, Development of 3-Dimensional Module Package, "System Block Module", 2001 Electronic Components and Technology Conference, Publication Date, May 29-Jun. 1, 2001, pp. 552-557.

(Continued)

*Primary Examiner* — Chris Chu
(74) *Attorney, Agent, or Firm* — TraskBritt

(57) ABSTRACT

Methods of forming pre-encapsulated frames comprise flowing a dielectric encapsulation material around at least one conductive trace. A cavity configured to receive at least one semiconductor device at least partially in the cavity is formed in the encapsulation material. A first connection area of the at least one trace is exposed within the cavity. At least another connection area of the at least one trace is exposed laterally adjacent to the cavity. The dielectric encapsulation material is hardened to form a pre-encapsulated frame.

17 Claims, 16 Drawing Sheets

U.S. PATENT DOCUMENTS

| | | | |
|---|---|---|---|
| 4,931,852 A | 6/1990 | Brown et al. | |
| 4,961,107 A | 10/1990 | Geist et al. | |
| 4,984,059 A | 1/1991 | Kubota et al. | |
| 4,994,411 A | 2/1991 | Naito et al. | |
| 5,019,673 A | 5/1991 | Juskey et al. | |
| 5,051,275 A | 9/1991 | Wong | |
| 5,086,018 A | 2/1992 | Conru et al. | |
| 5,101,465 A | 3/1992 | Murphy | |
| 5,108,955 A | 4/1992 | Ishida et al. | |
| 5,111,278 A | 5/1992 | Eichelberger | |
| 5,128,831 A | 7/1992 | Fox, III et al. | |
| 5,144,747 A | 9/1992 | Eichelberger | |
| 5,172,303 A | 12/1992 | Bernardoni et al. | |
| 5,173,764 A | 12/1992 | Higgins, III | |
| 5,184,208 A | 2/1993 | Sakuta et al. | |
| 5,194,930 A | 3/1993 | Papathomas et al. | |
| 5,218,759 A | 6/1993 | Juskey et al. | |
| 5,220,489 A | 6/1993 | Barreto et al. | |
| 5,241,133 A | 8/1993 | Mullen, III et al. | |
| 5,241,456 A | 8/1993 | Marcinkiewicz et al. | |
| 5,252,853 A | 10/1993 | Michii | |
| 5,266,834 A | 11/1993 | Nishi et al. | |
| 5,278,726 A | 1/1994 | Bernardoni et al. | |
| 5,280,192 A | 1/1994 | Kryzaniwsky | |
| 5,285,352 A | 2/1994 | Pastore et al. | |
| 5,286,679 A | 2/1994 | Farnworth et al. | |
| 5,293,068 A | 3/1994 | Kohno et al. | |
| 5,295,044 A | 3/1994 | Araki et al. | |
| 5,299,092 A | 3/1994 | Yaguchi et al. | |
| 5,304,842 A | 4/1994 | Farnworth et al. | |
| 5,311,060 A | 5/1994 | Rostoker et al. | |
| 5,313,096 A | 5/1994 | Eide | |
| 5,313,366 A | 5/1994 | Gaudenzi et al. | |
| 5,327,325 A | 7/1994 | Nicewarner, Jr. | |
| 5,334,857 A | 8/1994 | Mennitt et al. | |
| 5,344,795 A | 9/1994 | Hashemi et al. | |
| 5,373,189 A | 12/1994 | Massit et al. | |
| 5,376,825 A | 12/1994 | Tukamoto et al. | |
| 5,379,186 A | 1/1995 | Gold et al. | |
| 5,383,269 A | 1/1995 | Rathmell et al. | |
| 5,384,689 A | 1/1995 | Shen | |
| 5,394,303 A | 2/1995 | Yamaji | |
| 5,434,105 A | 7/1995 | Liou | |
| 5,436,203 A | 7/1995 | Lin | |
| 5,440,169 A | 8/1995 | Tomita et al. | |
| 5,441,684 A | 8/1995 | Lee | |
| 5,450,283 A | 9/1995 | Lin et al. | |
| 5,461,255 A | 10/1995 | Chan et al. | |
| 5,483,024 A | 1/1996 | Russell et al. | |
| 5,484,959 A | 1/1996 | Burns | |
| 5,488,254 A | 1/1996 | Nishimura et al. | |
| 5,489,538 A | 2/1996 | Rostoker et al. | |
| 5,489,801 A | 2/1996 | Blish, II | |
| 5,552,635 A | 9/1996 | Kim et al. | |
| 5,598,033 A | 1/1997 | Behlen et al. | |
| 5,598,034 A | 1/1997 | Wakefield | |
| 5,604,376 A | 2/1997 | Hamburgen et al. | |
| 5,608,265 A | 3/1997 | Kitano et al. | |
| 5,616,958 A | 4/1997 | Laine et al. | |
| 5,625,221 A | 4/1997 | Kim et al. | |
| 5,633,530 A | 5/1997 | Hsu | |
| 5,641,997 A | 6/1997 | Ohta et al. | |
| 5,652,461 A | 7/1997 | Ootsuki et al. | |
| 5,656,857 A | 8/1997 | Kishita | |
| 5,659,952 A | 8/1997 | Kovac et al. | |
| 5,661,086 A | 8/1997 | Nakashima et al. | |
| 5,668,405 A | 9/1997 | Yamashita | |
| 5,677,566 A | 10/1997 | King et al. | |
| 5,701,233 A | 12/1997 | Carson et al. | |
| 5,754,408 A | 5/1998 | Derouiche | |
| 5,770,889 A | 6/1998 | Rostoker et al. | |
| 5,781,415 A | 7/1998 | Itoh | |
| 5,798,564 A | 8/1998 | Eng et al. | |
| 5,814,885 A | 9/1998 | Pogge et al. | |
| 5,835,988 A | 11/1998 | Ishii | |
| 5,838,061 A * | 11/1998 | Kim | 257/686 |
| 5,844,315 A | 12/1998 | Melton et al. | |
| 5,866,953 A | 2/1999 | Akram et al. | |
| 5,883,426 A | 3/1999 | Tokuno et al. | |
| 5,952,611 A | 9/1999 | Eng et al. | |
| 5,952,714 A | 9/1999 | Sano et al. | |
| 5,973,403 A | 10/1999 | Wark | |
| 5,973,924 A | 10/1999 | Gillespie, Jr. | |
| 5,991,161 A | 11/1999 | Samaras et al. | |
| 6,013,946 A | 1/2000 | Lee et al. | |
| 6,013,948 A | 1/2000 | Akram et al. | |
| 6,031,284 A * | 2/2000 | Song | 257/701 |
| 6,093,029 A | 7/2000 | Kwon et al. | |
| 6,127,726 A | 10/2000 | Bright et al. | |
| 6,137,163 A | 10/2000 | Kim et al. | |
| 6,162,693 A | 12/2000 | Wang et al. | |
| 6,172,423 B1 | 1/2001 | Lee | |
| 6,172,874 B1 | 1/2001 | Bartilson | |
| 6,188,127 B1 * | 2/2001 | Senba et al. | 257/686 |
| 6,190,929 B1 | 2/2001 | Wang et al. | |
| 6,198,634 B1 | 3/2001 | Armezzani et al. | |
| 6,235,554 B1 | 5/2001 | Akram et al. | |
| 6,277,674 B1 | 8/2001 | Wang et al. | |
| 6,297,548 B1 | 10/2001 | Moden et al. | |
| 6,313,522 B1 | 11/2001 | Akram et al. | |
| 6,335,571 B1 | 1/2002 | Capote et al. | |
| 6,417,546 B2 | 7/2002 | Trivedi et al. | |
| 6,420,789 B1 | 7/2002 | Tay et al. | |
| 6,448,664 B1 | 9/2002 | Tay et al. | |
| 6,456,517 B2 | 9/2002 | Kim et al. | |
| 6,476,476 B1 | 11/2002 | Glenn | |
| 6,492,726 B1 | 12/2002 | Quek et al. | |
| 6,498,101 B1 | 12/2002 | Wang | |
| 6,501,165 B1 | 12/2002 | Farnworth et al. | |
| 6,503,805 B2 | 1/2003 | Wang et al. | |
| 6,511,868 B2 | 1/2003 | Wang et al. | |
| 6,522,018 B1 | 2/2003 | Tay et al. | |
| 6,522,019 B2 | 2/2003 | Tay et al. | |
| 6,522,375 B1 | 2/2003 | Jang et al. | |
| 6,541,395 B1 | 4/2003 | Trivedi et al. | |
| 6,548,330 B1 | 4/2003 | Murayama et al. | |
| 6,548,383 B1 | 4/2003 | Trivedi et al. | |
| 6,555,455 B1 | 4/2003 | Wang et al. | |
| 6,559,053 B1 | 5/2003 | Wang et al. | |
| 6,566,745 B1 | 5/2003 | Beyne et al. | |
| 6,573,592 B2 | 6/2003 | Bolken | |
| 6,583,518 B2 | 6/2003 | Trivedi et al. | |
| 6,586,826 B1 | 7/2003 | Glenn et al. | |
| 6,599,789 B1 | 7/2003 | Abbott et al. | |
| 6,600,335 B2 | 7/2003 | Tay et al. | |
| 6,613,617 B2 | 9/2003 | Trivedi et al. | |
| 6,614,104 B2 | 9/2003 | Farnworth et al. | |
| 6,634,100 B2 | 10/2003 | Akram et al. | |
| 6,650,007 B2 | 11/2003 | Moden et al. | |
| 6,666,751 B1 | 12/2003 | Wang | |
| 6,667,544 B1 | 12/2003 | Glenn | |
| 6,673,715 B2 | 1/2004 | Trivedi et al. | |
| 6,674,175 B2 | 1/2004 | Tay et al. | |
| 6,693,363 B2 | 2/2004 | Tay et al. | |
| 6,700,783 B1 | 3/2004 | Liu et al. | |
| 6,703,263 B2 | 3/2004 | Wang et al. | |
| 6,716,687 B2 | 4/2004 | Wang et al. | |
| 6,717,812 B1 | 4/2004 | Pinjala et al. | |
| 6,723,597 B2 | 4/2004 | Abbott et al. | |
| 6,730,553 B2 | 5/2004 | Cho et al. | |
| 6,734,905 B2 | 5/2004 | Fossum et al. | |
| 6,740,983 B2 | 5/2004 | Tay et al. | |
| 6,740,984 B2 | 5/2004 | Tay et al. | |
| 6,744,102 B2 | 6/2004 | Trivedi et al. | |
| 6,753,599 B2 | 6/2004 | Kim | |
| 6,753,616 B2 | 6/2004 | Coyle | |
| 6,767,778 B2 | 7/2004 | Wang et al. | |
| 6,770,921 B2 | 8/2004 | Trivedi et al. | |
| 6,773,960 B2 | 8/2004 | Fee et al. | |
| 6,774,022 B2 | 8/2004 | Wang et al. | |
| 6,777,794 B2 | 8/2004 | Nakajima | |
| 6,784,062 B2 | 8/2004 | Cho et al. | |
| 6,784,525 B2 | 8/2004 | Kuan et al. | |
| 6,787,923 B2 | 9/2004 | Tan et al. | |
| 6,792,142 B1 | 9/2004 | Wang | |
| 6,803,958 B1 | 10/2004 | Wang | |
| 6,808,994 B1 | 10/2004 | Wang | |

| | | |
|---|---|---|
| 6,812,103 B2 | 11/2004 | Wang et al. |
| 6,812,529 B2 | 11/2004 | Trivedi et al. |
| 6,833,627 B2 | 12/2004 | Farnworth |
| 6,835,599 B2 | 12/2004 | Kuan et al. |
| 6,847,220 B2 | 1/2005 | Tay et al. |
| 6,850,642 B1 | 2/2005 | Wang |
| 6,856,010 B2 | 2/2005 | Roeters et al. |
| 6,856,155 B2 | 2/2005 | Tay et al. |
| 6,858,926 B2 | 2/2005 | Moden et al. |
| 6,864,155 B2 | 3/2005 | Wang |
| 6,867,131 B2 | 3/2005 | Wang et al. |
| 6,870,247 B2 | 3/2005 | Fee et al. |
| 6,872,660 B2 | 3/2005 | Trivedi et al. |
| 6,876,087 B2 * | 4/2005 | Ho et al. ............... 257/778 |
| 6,900,494 B2 | 5/2005 | Abbott et al. |
| 6,903,420 B2 | 6/2005 | Wang |
| 6,906,407 B2 | 6/2005 | Byers et al. |
| 6,906,415 B2 | 6/2005 | Jiang et al. |
| 6,913,476 B2 | 7/2005 | Yean et al. |
| 6,927,473 B2 | 8/2005 | Wang et al. |
| 6,930,029 B2 | 8/2005 | Wang et al. |
| 6,936,894 B2 | 8/2005 | Wang |
| 6,946,325 B2 | 9/2005 | Yean et al. |
| 6,949,479 B2 | 9/2005 | Wang |
| 6,951,777 B2 | 10/2005 | Fee et al. |
| 6,962,841 B2 | 11/2005 | Trivedi et al. |
| 6,972,214 B2 | 12/2005 | Kuan et al. |
| 6,972,794 B1 | 12/2005 | Wang et al. |
| 6,974,757 B2 | 12/2005 | Wang |
| 6,977,419 B2 | 12/2005 | Wang et al. |
| 6,982,491 B1 * | 1/2006 | Fan et al. ............... 257/778 |
| 6,984,570 B2 | 1/2006 | Wang |
| 6,987,291 B2 | 1/2006 | Abbott et al. |
| 7,009,188 B2 | 3/2006 | Wang |
| 7,012,293 B2 | 3/2006 | Wang |
| 7,013,044 B2 | 3/2006 | Wang |
| 7,018,871 B2 | 3/2006 | Tan et al. |
| 7,026,548 B2 | 4/2006 | Bolken et al. |
| 7,030,640 B2 | 4/2006 | Yee et al. |
| 7,061,124 B2 | 6/2006 | Tan et al. |
| 7,071,012 B2 | 7/2006 | Tan et al. |
| 7,095,083 B2 | 8/2006 | Cho et al. |
| 7,097,036 B2 | 8/2006 | Morita |
| 7,109,105 B2 | 9/2006 | Wang et al. |
| 7,112,471 B2 * | 9/2006 | Boon et al. ............... 438/116 |
| 7,112,482 B2 | 9/2006 | Abbott et al. |
| 7,112,876 B2 | 9/2006 | Fee et al. |
| 7,116,122 B2 | 10/2006 | Tay et al. |
| 7,145,228 B2 | 12/2006 | Yean et al. |
| 7,151,303 B2 | 12/2006 | Wang et al. |
| 7,153,731 B2 | 12/2006 | Abbott et al. |
| 7,154,146 B2 | 12/2006 | Wang et al. |
| 7,169,645 B2 | 1/2007 | Bolken et al. |
| 7,169,662 B2 | 1/2007 | Cho et al. |
| 7,186,168 B2 | 3/2007 | Wang |
| 7,189,606 B2 | 3/2007 | Wang et al. |
| 7,190,074 B2 | 3/2007 | Tan et al. |
| 7,198,980 B2 | 4/2007 | Jiang et al. |
| 7,205,656 B2 | 4/2007 | Kim et al. |
| 7,206,447 B2 | 4/2007 | Wang |
| 7,217,994 B2 | 5/2007 | Zhu et al. |
| 7,223,626 B2 | 5/2007 | Farnworth et al. |
| 7,224,020 B2 | 5/2007 | Wang et al. |
| 7,230,343 B2 | 6/2007 | Wang et al. |
| 7,245,007 B1 | 7/2007 | Foster |
| 7,247,933 B2 | 7/2007 | Juskey et al. |
| 7,253,493 B2 | 8/2007 | Wang et al. |
| 7,259,435 B2 | 8/2007 | Wang |
| 7,285,442 B2 | 10/2007 | Moden et al. |
| 7,285,848 B2 | 10/2007 | Onodera et al. |
| 7,285,971 B2 | 10/2007 | Yee et al. |
| 7,290,080 B2 | 10/2007 | Patel |
| 7,314,812 B2 | 1/2008 | Wang |
| 7,327,020 B2 | 2/2008 | Kwon et al. |
| 7,339,257 B2 | 3/2008 | Ozawa et al. |
| 7,341,881 B2 | 3/2008 | Watkins et al. |
| 7,344,917 B2 | 3/2008 | Gautham |
| 7,348,215 B2 | 3/2008 | Lee |
| 7,537,959 B2 | 5/2009 | Lee et al. |
| 7,589,410 B2 | 9/2009 | Kim |
| 7,759,785 B2 | 7/2010 | Corisis et al. |
| 7,781,877 B2 | 8/2010 | Jiang et al. |
| 7,791,205 B2 * | 9/2010 | Bolken ............... 257/774 |
| 8,072,082 B2 * | 12/2011 | Yean et al. ............... 257/777 |
| 2001/0006828 A1 | 7/2001 | McMahon |
| 2003/0205826 A1 | 11/2003 | Lin et al. |
| 2003/0209787 A1 * | 11/2003 | Kondo et al. ............... 257/673 |
| 2004/0042190 A1 | 3/2004 | Eng et al. |
| 2004/0253762 A1 | 12/2004 | Lee |
| 2005/0054141 A1 | 3/2005 | Kim et al. |
| 2005/0090050 A1 | 4/2005 | Shim et al. |
| 2005/0253211 A1 * | 11/2005 | Minamio et al. ............... 257/432 |
| 2005/0258853 A1 | 11/2005 | Sorimachi |
| 2005/0275750 A1 | 12/2005 | Akram et al. |
| 2006/0071314 A1 | 4/2006 | Ho et al. |
| 2006/0108676 A1 | 5/2006 | Punzalan, Jr. et al. |
| 2006/0113598 A1 | 6/2006 | Chen et al. |
| 2006/0118933 A1 | 6/2006 | Haba |
| 2006/0186514 A1 | 8/2006 | Shim et al. |
| 2006/0188933 A1 | 8/2006 | Flavell et al. |
| 2006/0194373 A1 | 8/2006 | Fee et al. |
| 2006/0220208 A1 | 10/2006 | Onodera et al. |
| 2006/0220209 A1 | 10/2006 | Karnezos et al. |
| 2006/0220210 A1 | 10/2006 | Mendlein et al. |
| 2007/0004089 A1 | 1/2007 | Ebihara et al. |
| 2007/0007641 A1 | 1/2007 | Lee et al. |
| 2007/0048969 A1 | 3/2007 | Kwon et al. |
| 2007/0132081 A1 | 6/2007 | Wang et al. |
| 2007/0145556 A1 | 6/2007 | Bolken et al. |
| 2007/0166876 A1 | 7/2007 | Kim et al. |
| 2007/0190690 A1 | 8/2007 | Chow et al. |
| 2007/0210443 A1 | 9/2007 | Merilo et al. |
| 2007/0290318 A1 | 12/2007 | Tao et al. |
| 2008/0026506 A1 | 1/2008 | Kim et al. |
| 2008/0042252 A1 | 2/2008 | Moden et al. |
| 2008/0048301 A1 | 2/2008 | Wang et al. |
| 2008/0048302 A1 | 2/2008 | Lee et al. |
| 2008/0054432 A1 | 3/2008 | Corisis et al. |
| 2008/0277914 A1 | 11/2008 | Carine et al. |
| 2009/0267171 A1 | 10/2009 | Yean et al. |

FOREIGN PATENT DOCUMENTS

| | | |
|---|---|---|
| JP | 56004241 | 1/1981 |
| JP | 6094744 | 5/1985 |
| JP | 60178651 | 9/1985 |
| JP | 62109326 | 5/1987 |
| JP | 62115834 | 5/1987 |
| JP | 62-261133 A | 11/1987 |
| JP | 2306639 | 12/1990 |
| JP | 4157758 | 5/1992 |
| JP | 2004312008 | 4/2004 |
| JP | 2007288189 | 1/2007 |
| KR | 1062512 | 7/2001 |
| TW | 0242869 | 11/2005 |
| TW | 0255023 | 5/2006 |
| TW | 278947 | 4/2007 |
| WO | 0070676 | 11/2000 |
| WO | 2005083789 | 9/2005 |

OTHER PUBLICATIONS

Lin et al., Bumpless Flip Chip Packages for Cost/Performance Driven Devices, Electronic Components and Technology, Conference 2003, Publication Date, May 27-30, 2003, pp. 554-559.

Mita et al., Advanced TAB/BGA Multi-Chip Stacked Module for High Density LSI Packages, IEEE, Multi-Chip Module Conference, 1994, Publication Date Mar. 15-17, 1994, pp. 68-76.

Pienimaa et al., Stacked Modular Package, Advanced Packaging, IEEE Transactions, Publication Date, Aug. 2004, vol. 27, Issue 3, pp. 461-466.

Rencz, Thermal Qualification of 3D Stacked Die Structures, Budapest University of Technology and Economics, Department of Electron Devices, 2006.

Search Report for Singapore Application No. 200803157-7, mailed Aug. 25, 2009, eight (8) pages.

Written Opinion for Singapore Application No. 200803157-7, mailed Nov. 11, 2011, ten (10) pages.

* cited by examiner

METHODS OF FORMING AND ASSEMBLING PRE-ENCAPSULATED ASSEMBLIES AND OF FORMING ASSOCIATED SEMICONDUCTOR DEVICE PACKAGES

CROSS-REFERENCE TO RELATED APPLICATIONS

This application is a divisional of U.S. patent application Ser. No. 12/128,575, filed May 28, 2008, now U.S. Pat. No. 8,072,082, issued Dec. 6, 2011, the disclosure of which is hereby incorporated herein by this reference in its entirety. The subject matter of this application is related to U.S. patent application Ser. No. 11/874,531, filed Oct. 18, 2007, now U.S. Pat. No. 7,829,991, issued Nov. 9, 2010, which is a divisional of U.S. patent application Ser. No. 11/063,403, filed Feb. 22, 2005, now U.S. Pat. No. 7,285,442, issued Oct. 23, 2007, which is a continuation of U.S. patent application Ser. No. 10/706,210, filed Nov. 12, 2003, now U.S. Pat. No. 6,858,926, issued Feb. 22, 2005, which is a divisional of U.S. patent application Ser. No. 09/924,635, filed Aug. 8, 2001, now U.S. Pat. No. 6,650,007, issued Nov. 18, 2003, which is a continuation of U.S. patent application Ser. No. 09/344,279, filed Jun. 30, 1999, now U.S. Pat. No. 6,297,548, issued Oct. 2, 2001, which claims the benefit of U.S. Provisional Application No. 60/091,205 filed Jun. 30, 1998, the disclosure of each of which is incorporated herein in its entirety by reference.

FIELD

This invention relates generally to connectors for high-density semiconductor device configurations using a pre-encapsulated cavity interposer.

BACKGROUND

In response to the demand for semiconductor device packages having the ability to include the largest number of semiconductor devices in the smallest physical space, all components of such packages must occupy the least possible physical volume and use the most efficient manner to interconnect with each other and a power source.

It is known to form packages for semiconductor devices that include semiconductor memory devices of different types as well as other semiconductor devices with the package being connected to a printed circuit board. As it has become desirable for the amount of physical space that the package occupies to decrease, even though the number of semiconductor devices in the package is increasing, and desirable to have improvements in attachment techniques used for attaching the semiconductor devices to each other in the package itself and the attachment of the package to a printed circuit board are necessary.

While the use of lead frames and wire bonds to connect semiconductor devices is well known, such techniques can be further advanced. Similarly, while the use of lead frames and flip-chip type attachment techniques to connect semiconductor devices is well known, such techniques can be further advanced. Additionally, while the use of solder bumps to connect semiconductor packages in packages to printed circuit boards is well known, such can be further advanced.

BRIEF SUMMARY

In some embodiments, methods of forming pre-encapsulated frames comprise flowing a dielectric encapsulation material around at least one conductive trace. A cavity configured to receive at least one semiconductor device at least partially in the cavity is formed in the encapsulation material. A first connection area of the at least one trace is exposed within the cavity. At least another connection area of the at least one trace is exposed laterally adjacent to the cavity. The dielectric encapsulation material is hardened to form a pre-encapsulated frame.

In other embodiments, methods of forming semiconductor device packages comprise flowing a dielectric encapsulation material around at least one conductive trace. A cavity configured to receive at least one semiconductor device at least partially in the cavity is formed in the encapsulation material. A first connection area of the at least one trace is exposed within the cavity. At least another connection area of the at least one trace is exposed laterally adjacent to the cavity. The dielectric encapsulation material is hardened to form a pre-encapsulated frame. At least one semiconductor device is at least partially disposed in the cavity with an active surface of the at least one semiconductor device facing the first connection area of the at least one trace. The first connection area of the at least one trace is connected to the active surface of the at least one semiconductor device.

In still other embodiments, methods of assembling pre-encapsulated assemblies comprise attaching an imaging semiconductor device to an first encapsulated structure having a cavity therein, the cavity having a portion of the first encapsulated structure extending thereover, another portion extending therearound, and an aperture in the top thereof and a plurality of traces located in the first encapsulated structure. Each trace has a first portion extending in the portion of the first encapsulated structure extending over the cavity and a second portion extending in the another portion of the encapsulated member connected to the first portion with one end of the second portion being exposed for connection thereto. An adhesive contacting a portion of the first encapsulated structure and a portion of the imaging semiconductor device is dispensed. A transparent member is attached to the first encapsulated structure by contacting the adhesive. The cavity in the encapsulated member is sealed using a liquid material. Solder material is placed on the first encapsulated structure in a pattern.

DETAILED DESCRIPTION

Figure 1:
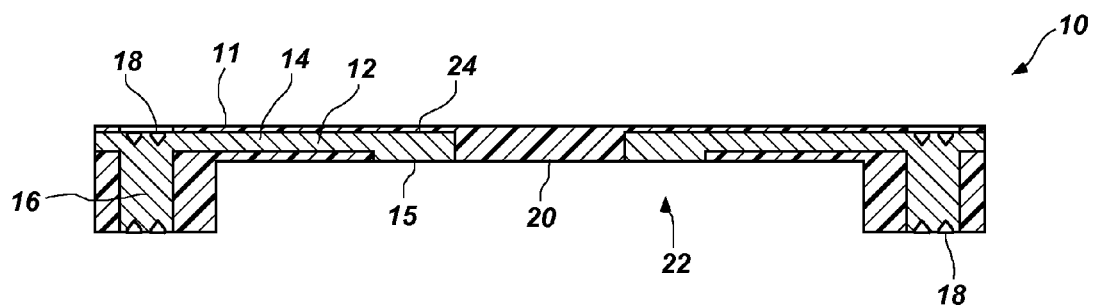
FIG. 1 is a cross-sectional view of a pre-encapsulated frame.

Referring to drawing FIG. 1, a pre-encapsulated cavity interposer 10, hereinafter referred to as a pre-encapsulated frame 10, is illustrated in cross section. The pre-encapsulated cavity frame 10 comprises a pre-encapsulated member 11, the frame 10, formed of encapsulating compound 20 having any desired configuration for a semiconductor device to be retained in the member 11 in a cavity 22 therein and having a plurality of traces 12 including a first portion 14, typically extending horizontally, having any desired shape and configuration, such as rectangular, square, etc., and a second portion 16, typically extending orthogonally from the first portion 14, although they may extend at any desired angle, as a post like structure having any desired shape and configuration, such as round, rectangular, square, hexagonal, triangular, elliptical, u-shaped, c-shaped, curved in cross-sectional shape, etc. As many second portions 16 of a trace 12 may be attached in serial fashion to the first portion 14 of a trace 12, which are illustrated herein. The traces 12 include connection areas 18 formed in the ends of the second portions 16, which may include grooves therein or roughened surfaces thereon, as desired, for enhanced joint connections, although the connection areas 18 ends may be smooth, an encapsulating compound 20 covering portions of the traces 12, and a cavity 22 formed by the traces 12 and encapsulating compound 20 of the frame 11 for the installation of any desired number, shapes, and types of semiconductor devices therein. The cavity 22 surrounds and encloses any semiconductor device or semiconductor devices installed therein on the top and sides thereof. The cavity 22 having a desired size and a thickness essentially that approximate the semiconductor device to be installed therein, although the cavity 22 can be any desired size and thickness for use with different types of semiconductor devices to be installed therein.

The traces 12 may be formed of any suitable metal material, such as copper, copper alloy, etc., of any desired thickness of metal material suitable for the application of the pre-encapsulated cavity interposer 10. Any desired metal coating, such as a layer of gold, silver, nickel, palladium, alloys thereof, etc., and/or any desired coating of material may be used on the traces 12 at any desired location thereon for any purpose. The encapsulating compound 20 may be of any suitable type for the application for the pre-encapsulated cavity interposer 10 and may contain any suitable amount of filler material and other additives therein, if desired for the formation of the pre-encapsulated frame 11. The encapsulating compound 20 surrounds each trace 12 insulating the trace 12 while providing a suitable connection area 15 on the first portion 14 for connection to a semiconductor device and connection areas 18 on the second portion. The connection area 15 may include any desired layers of metal thereon, such as gold, silver, nickel, palladium, alloys thereof, etc. A surface 24 formed opposite of the cavity 22 of the pre-encapsulated cavity interposer 10 is generally planar having areas free of encapsulation material for the connection areas 18 of the second portions 16 of the traces 12. If desired, the surface 24 may include other areas free of encapsulation material 10 for connection areas for the first portion 14 of a trace 12 (not shown) so that both the first portion 14 and second portion 16 of a trace may include connection areas on the upper and lower surfaces thereof. Similarly, if desired, the surface 24 may have a cavity of any desired sized and shape, such as cavity 22, formed therein (not shown).

The pre-encapsulated cavity frame 10 may be formed in strip form of any desired length and configuration pattern or in panel form having any desired geometric shape and physical size. The pre-encapsulated cavity frame 10 is constructed using a base material (not shown), having the traces 12 patterned on the base material having any size, pitch, pattern, shape, thickness, length, etc., with the encapsulating compound 20 providing support for the traces 12 being applied thereover. After the formation of the pre-encapsulated cavity interposer 10 on the base material, the base material is removed leaving the pre-encapsulation frame 10. The pre-encapsulated cavity frame 10 may be formed for stacking of multiple pre-encapsulation frames having any desired number of semiconductor devices therein one on top the other being electrically interconnected by the connection areas 18 of the ends of the second portions 16 of the traces 12 contacting each other as desired.

Figure 1A:
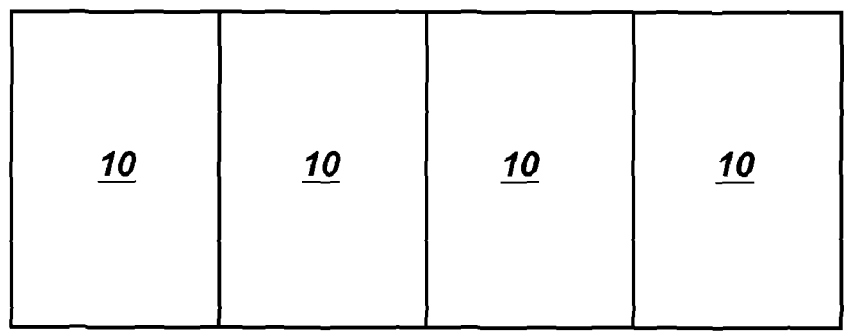
FIG. 1A is a view of a portion of a strip of pre-encapsulated frames.

Referring to drawing FIG. 1A, illustrated in a top view is a portion of a strip of pre-encapsulation frames 10, which may be cut or severed into individual pre-encapsulation frames 10 at any desired time of use.

Figure 1B:
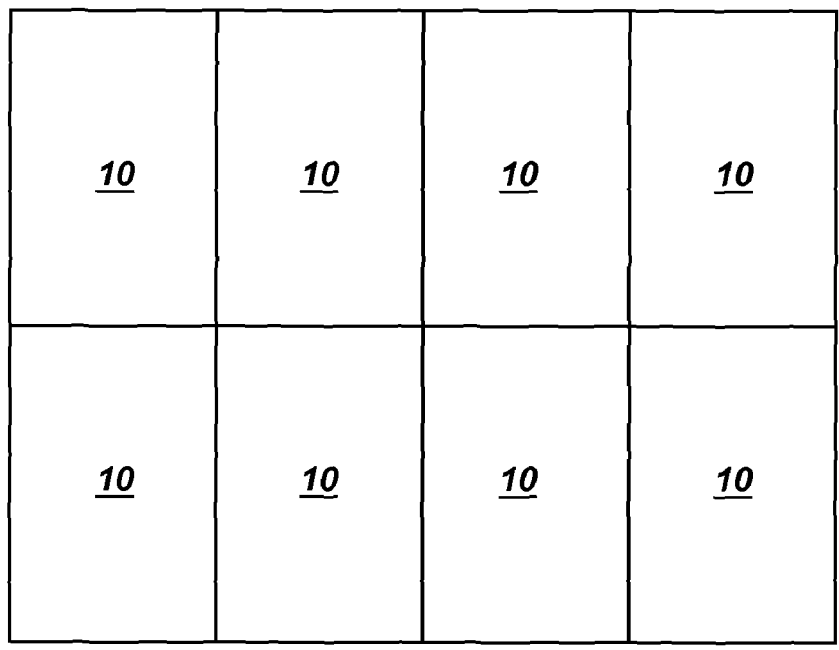
FIG. 1B is a view of a portion of a panel of pre-encapsulated frames.

Referring to drawing FIG. 1B, illustrated in a top view is a portion of a panel of pre-encapsulation frames 10, which may be cut or severed into individual pre-encapsulation frames 10 at any desired time of use.

Figure 2:
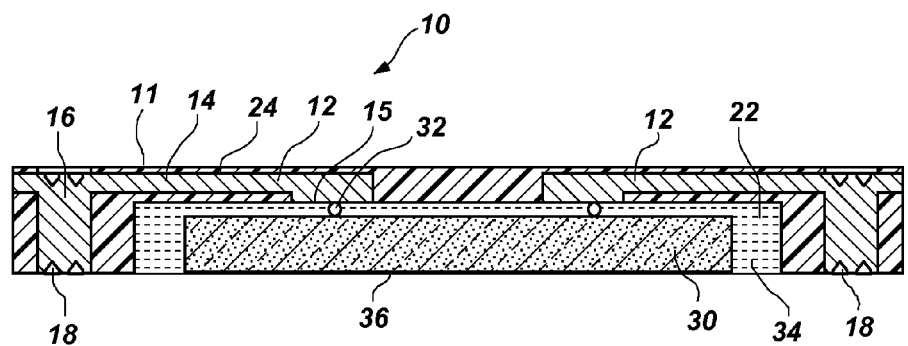
FIG. 2 is a cross-sectional view of a pre-encapsulated frame having a semiconductor device installed therein.

Referring to drawing FIG. 2, the pre-encapsulated cavity frame 10 is illustrated in cross section having a flip-chip type semiconductor device 30 attached to connection areas 15 of the first portions 14 of a leads 12 using solder balls 32, or solder bumps, solder stud bumps, or gold stud bumps located between bond pads of the semiconductor device 30 and the connection areas 15. The cavity 22 of the pre-encapsulated cavity frame 10 having the semiconductor device 30 located therein is filled with any suitable liquid encapsulant material 34 (e.g., an underfill material, etc.) to retain and environmentally seal the semiconductor device 30 in the cavity 22 forming an essentially planar lower surface 36 opposite the surface 24 of the pre-encapsulated cavity interposer 10 at essentially the same level as that of the lower surface 18 of the second portion 16 of traces 12.

Figure 2A:
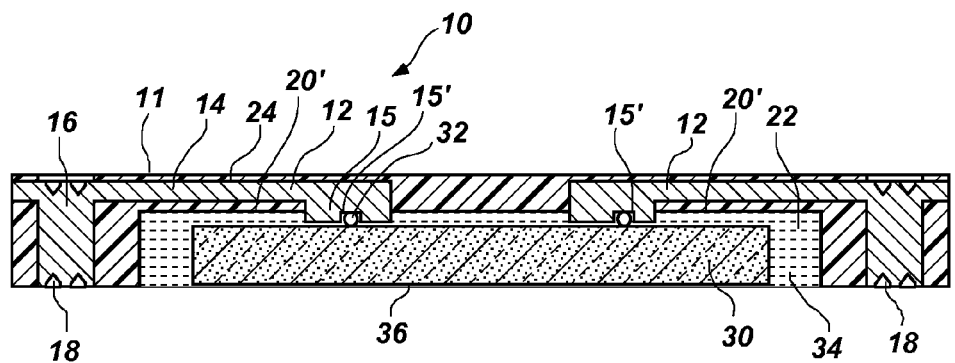
FIG. 2A is a cross-sectional view of an alternative pre-encapsulated frame having a semiconductor device installed therein.

Referring to drawing FIG. 2A, the pre-encapsulated cavity frame 10 is illustrated in cross section having a flip-chip type semiconductor device 30 attached to connection areas 15, which extend below the lower surface 20' of the encapsulating compound 20 covering the lower surface 18 of the second portion 16 of the traces 12 having one or more grooves or recesses 15' therein of the first portions 14 of a leads 12 using solder balls 32, or solder bumps, solder stud bumps, or gold stud bumps located between bond pads of the semiconductor device 30 and the connection areas 15. The one or more grooves or recesses 15' in the connection areas facilitate the location of the semiconductor device 30 in the cavity 22 in the proper location with respect to connection areas 15 using conventional semiconductor device attachment equipment. The one or more grooves or recesses 15' may be formed having any suitable geometric shape and desired depth in the connections areas 15 by any suitable method, such as etching, coining, laser forming, etc. The cavity 22 of the pre-encapsulated cavity frame 10 having the semiconductor device 30 located therein is filled with any suitable liquid encapsulant material 34 (e.g., an underfill material, etc.) to retain and environmentally seal the semiconductor device 30 in the cavity 22 forming an essentially planar lower surface 36 opposite the surface 24 of the pre-encapsulated cavity interposer 10 at essentially the same level as that of the lower surface 18 of the second portion 16 of traces 12.

Figure 2B:
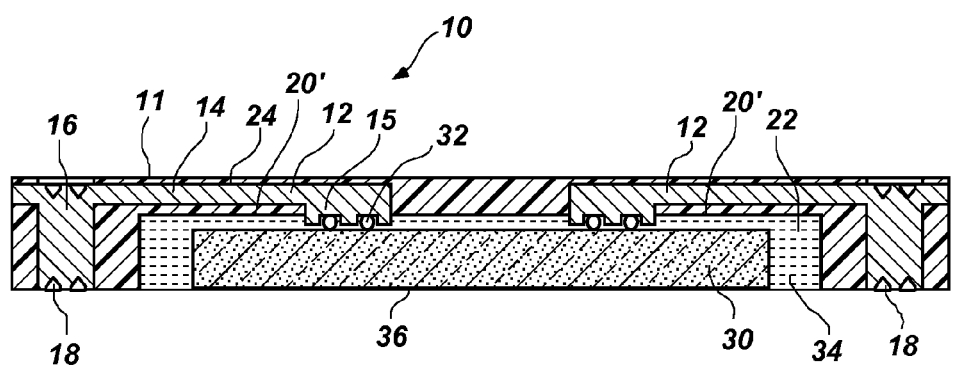
FIG. 2B is a cross-sectional view of an alternative pre-encapsulated frame having a semiconductor device installed therein.

Referring to drawing FIG. 2B, the pre-encapsulated cavity frame 10 is illustrated in cross section having a flip-chip type semiconductor device 30 attached to connection areas 15, which extend below the lower surface 20' of the encapsulating compound 20 covering the lower surface 18 of the second portion 16 of the traces 12 having two or more grooves or recesses 15' therein of the first portions 14 of a leads 12 using two or more solder balls 32, or solder bumps, solder stud bumps, or gold stud bumps located between bond pads of the semiconductor device 30 and the connection areas 15. The two or more grooves or recesses 15' in the connection areas facilitate the location of the semiconductor device 30 in the cavity 22 in the proper location with respect to connection areas 15 using conventional semiconductor device attachment equipment. The two or more grooves or recesses 15' may be formed having any suitable geometric shape and desired depth in the connections areas 15 by any suitable method, such as etching, coining, laser forming, etc. The cavity 22 of the pre-encapsulated cavity frame 10 having the semiconductor device 30 located therein is filled with any suitable liquid encapsulant material 34 (e.g., underfill material, etc.) to retain and environmentally seal the semiconductor device 30 in the cavity 22 forming an essentially planar lower surface 36 opposite the surface 24 of the pre-encapsulated cavity interposer 10 at essentially the same level as that of the lower surface 18 of the second portion 16 of traces 12.

Figure 2C:
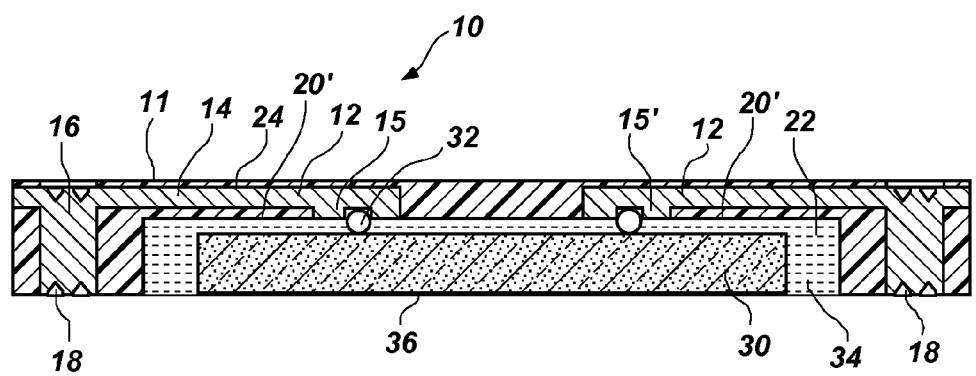
FIG. 2C is a cross-sectional view of an alternative pre-encapsulated frame having a semiconductor device installed therein.

Referring to drawing FIG. 2C, the pre-encapsulated cavity frame 10 is illustrated in cross section having a flip-chip type semiconductor device 30 attached to connection areas 15, which are located at essentially the same level as the lower surface 20' of the encapsulating compound 20 having one or more grooves or recesses 15' therein of the first portions 14 of a leads 12 using solder balls 32, or solder bumps, solder stud bumps, or gold stud bumps located between bond pads of the semiconductor device 30 and the connection areas 15. The one or more grooves or recesses 15' in the connection areas facilitate the location of the semiconductor device 30 in the cavity 22 in the proper location with respect to connection areas 15 using conventional semiconductor device attachment equipment. The one or more grooves or recesses 15' may be formed having any suitable geometric shape and desired depth in the connections areas 15 by any suitable method, such as etching, coining, laser forming, etc. The cavity 22 of the pre-encapsulated cavity frame 10 having the semiconductor device 30 located therein is filled with any suitable liquid encapsulant material 34 (e.g., underfill material, etc.) to retain and environmentally seal the semiconductor device 30 in the cavity 22 forming the essentially planar lower surface 36 opposite the surface 24 of the pre-encapsulated cavity interposer 10 at essentially the same level as that of the lower surface 18 of the second portion 16 of traces 12.

Figure 2D:
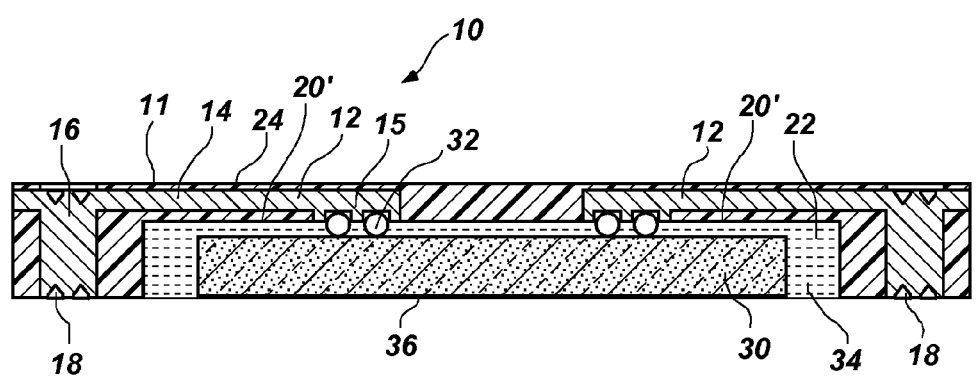
FIG. 2D is a cross-sectional view of an alternative pre-encapsulated frame having a semiconductor device installed therein.

Referring to drawing FIG. 2D, the pre-encapsulated cavity frame 10 is illustrated in cross section having a flip-chip type semiconductor device 30 attached to connection areas 15, which extend below the lower surface 20' of the encapsulating compound 20 covering the lower surface 18 of the second portion 16 of the traces 12 having two or more grooves or recesses 15' therein of the first portions 14 of a leads 12 using two or more solder balls 32, or solder bumps, solder stud bumps, or gold stud bumps located between bond pads of the semiconductor device 30 and the connection areas 15. The two or more grooves or recesses 15' in the connection areas facilitate the location of the semiconductor device 30 in the cavity 22 in the proper location with respect to connection areas 15 using conventional semiconductor device attachment equipment. The two or more grooves or recesses 15' may be formed having any suitable geometric shape and desired depth in the connections areas 15 by any suitable method, such as etching, coining, laser forming, etc. The cavity 22 of the pre-encapsulated cavity frame 10 having the semiconductor device 30 located therein is filled with any suitable liquid encapsulant material 34 (e.g., underfill material, etc.) to retain and environmentally seal the semiconductor device 30 in the cavity 22 forming an essentially planar lower surface 36 opposite the surface 24 of the pre-encapsulated cavity interposer 10 at essentially the same level as that of the lower surface 18 of the second portion 16 of traces 12.

Figure 2E:
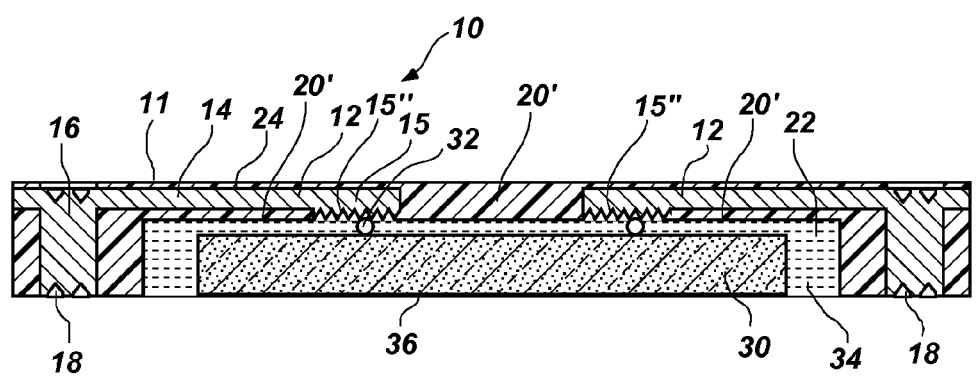
FIG. 2E is a cross-sectional view of an alternative pre-encapsulated frame having a semiconductor device installed therein.

Referring to drawing FIG. 2E, the pre-encapsulated cavity frame 10 is illustrated in cross section having a flip-chip type semiconductor device 30 attached to connection areas 15, which are located at essentially the same level as the lower surface 20' of the encapsulating compound 20 having a roughened surface 15" therein of the first portions 14 of a leads 12 using solder balls 32, or solder bumps, solder stud bumps, or gold stud bumps located between bond pads of the semiconductor device 30 and the connection areas 15. The roughened surface 15" in the connection areas 15 facilitate the location of the semiconductor device 30 in the cavity 22 in the proper location with respect to connection areas 15 using conventional semiconductor device attachment equipment. The roughened surface 15" may be formed having any suitable geometric shape and desired depth in the connections areas 15 by any suitable method, such as etching, coining, laser forming, etc. The cavity 22 of the pre-encapsulated cavity frame 10 having the semiconductor device 30 located therein is filled with any suitable liquid encapsulant material 34 (e.g, underfill material, etc.) to retain and environmentally seal the semiconductor device 30 in the cavity 22 forming an essentially planar lower surface 36 opposite the surface 24 of the pre-encapsulated cavity interposer 10 at essentially the same level as that of the lower surface 18 of the second portion 16 of traces 12.

Figure 3:
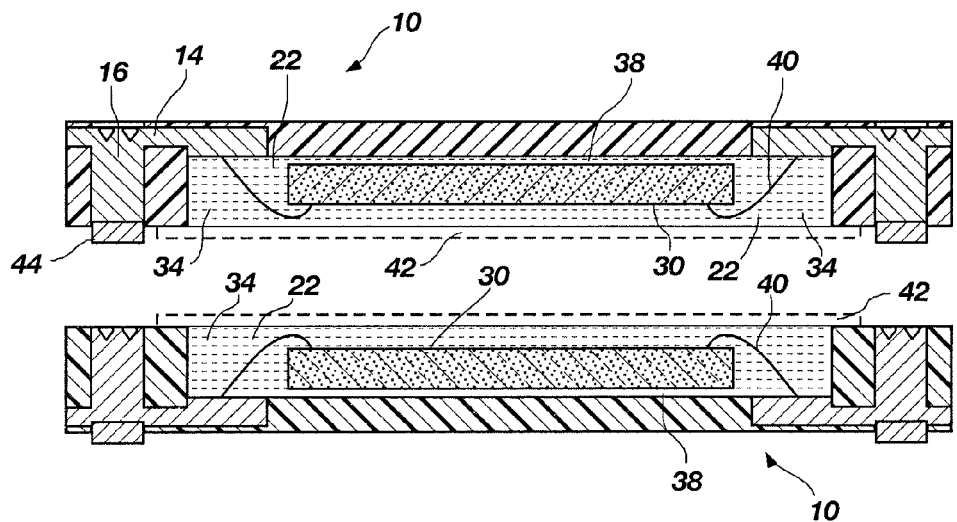
FIG. 3 is a cross-sectional view of two stacked pre-encapsulated frames each having a semiconductor device installed therein and connected using bond wires.

Referring to drawing FIG. 3, a pair of pre-encapsulated cavity frames 10 are illustrated in cross section, each having a semiconductor device 30 located in cavity 22. Each semiconductor device 30 is attached to the encapsulating compound 20 using a suitable adhesive 38, which may be either a layer of adhesive or a double-sided adhesive tape, to retain the semiconductor device 30 in the cavity 22 prior to the filling of the cavity 22 with any suitable liquid encapsulant material 34 (e.g., underfill material, etc.) to retain and environmentally seal the semiconductor device 30 in the cavity 22 forming an essentially planar lower surface 36 opposite the surface 24 of the pre-encapsulated cavity frame 10 at essentially the same level as that of the lower surface 18 of the second portion 16 of traces 12. As illustrated, the first portions of the traces 12 are connected to the bond pads of the semiconductor device 30 using bond wires 40, rather than a flip-chip style type of attachment. If desired, an anisotropic conductive film 42 (shown in dashed lines) or non-conductive film 42 (shown in dashed lines) may be used to seal the semiconductor device 30 in the cavity 22 without the use of an encapsulant material 34 in the cavity 22. A solder paste 44 may be applied to the connection areas 18 of the second portion of traces 12 for reflow and connection of the pre-encapsulated cavity interposers 10.

Figure 4:
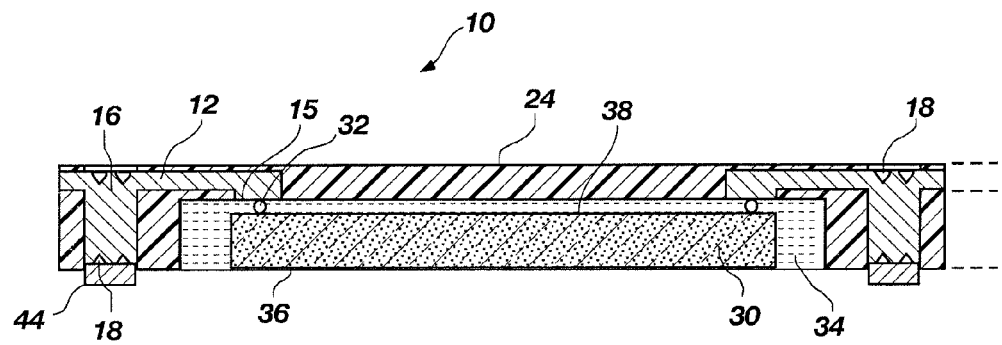
FIG. 4 is a cross-sectional view of a pre-encapsulated frame having a semiconductor device installed therein having two sides of bond pads on the active surface thereof.

Referring to drawing FIG. 4, the pre-encapsulation frame 10 is illustrated in cross section having a flip-chip type semiconductor device 30 having bond pads on the active surface thereof about two sides of the semiconductor device 30 attached to the first portion 14 of the traces 12 with the cavity 22 filled with any suitable liquid encapsulant material 34 (e.g., underfill material, etc.) to retain and seal the semiconductor device 30 in the cavity 22 forming an essentially planar lower surface 36 opposite the surface 24 of the pre-encapsulated cavity frame 10 at essentially the same level as that of the lower surface 18 of the second portion 16 of traces 12. If desired, a layer of adhesive or a double-sided adhesive tape 38 may be used to retain the semiconductor device 30 in the cavity 22 prior to the reflow of the solder balls 32 to attach the semiconductor device 30 to the connection areas 15 of the first portion 14 of the traces 12.

Figure 5:
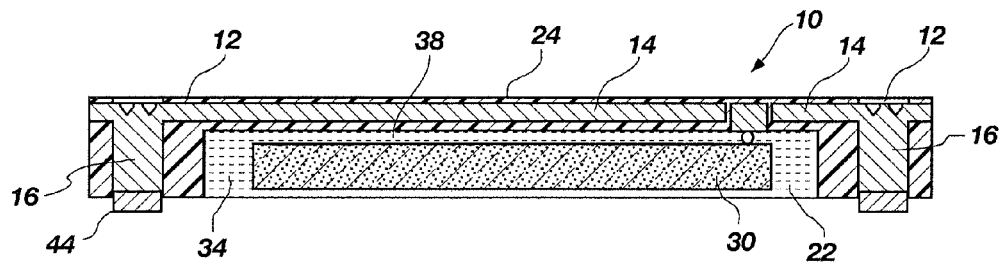
FIG. 5 is a cross-sectional view of a pre-encapsulated frame having a semiconductor device installed therein having one side of bond pads on the active surface thereof.

Referring to drawing FIG. 5, the pre-encapsulated cavity frame 10 is illustrated in cross section configured to a semiconductor device 30 having bond pads on the active surface thereof along one side thereof. The traces 12 are formed in a pattern so that a first portion 14 of one trace is longer than the first portion 14 of another trace 12 to connect to a desired bond pad on the semiconductor device 30 in a flip-chip style type of arrangement described hereinbefore.

Figure 5A:
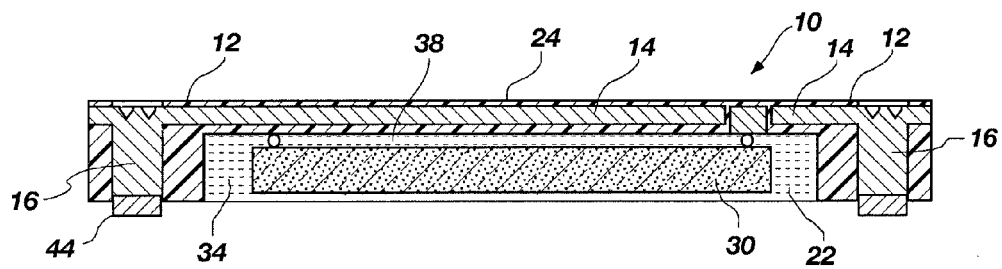
FIG. 5A is a cross-sectional view of a pre-encapsulated frame having a semiconductor device installed therein having 1.5 sides of bond pads on the active surface thereof.

Referring to drawing FIG. 5A, the pre-encapsulated cavity frame 10 is illustrated in cross section configured to a semiconductor device 30 having bond pads on the active surface thereof in a 1.5 sided configuration as known in the art. The traces 12 are formed in a pattern so that a first portion 14 of one trace is longer than the first portion 14 of another trace 12 to connect to a desired bond pad on the semiconductor device 30 in a flip-chip style type of arrangement described hereinbefore.

Figure 5B:
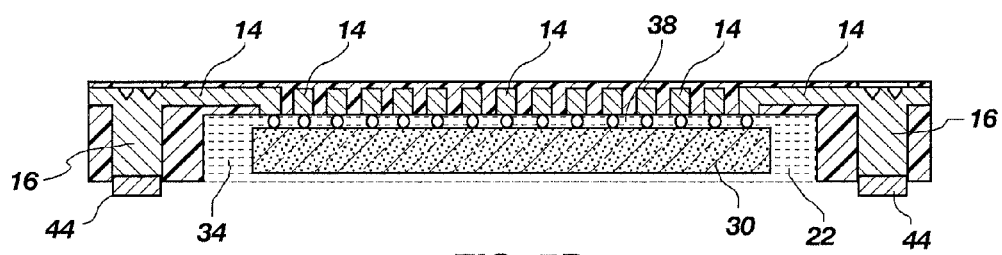
FIG. 5B is a cross-sectional view of a pre-encapsulated frame having a semiconductor device installed therein having one side of bond pads on the active surface thereof along the long side of the semiconductor device.

Referring to drawing FIG. 5B, the pre-encapsulated cavity frame 10 is illustrated in cross section configured to a semiconductor device 30 having bond pads on the active surface thereof solely along the long side of the semiconductor device 30. The traces 12 are formed to in a pattern to vary in length and configuration so that the first portion 14 of a trace connects to a desired bond pad of the semiconductor device 30 in a flip-chip style type arrangement described hereinbefore.

Figure 5C:
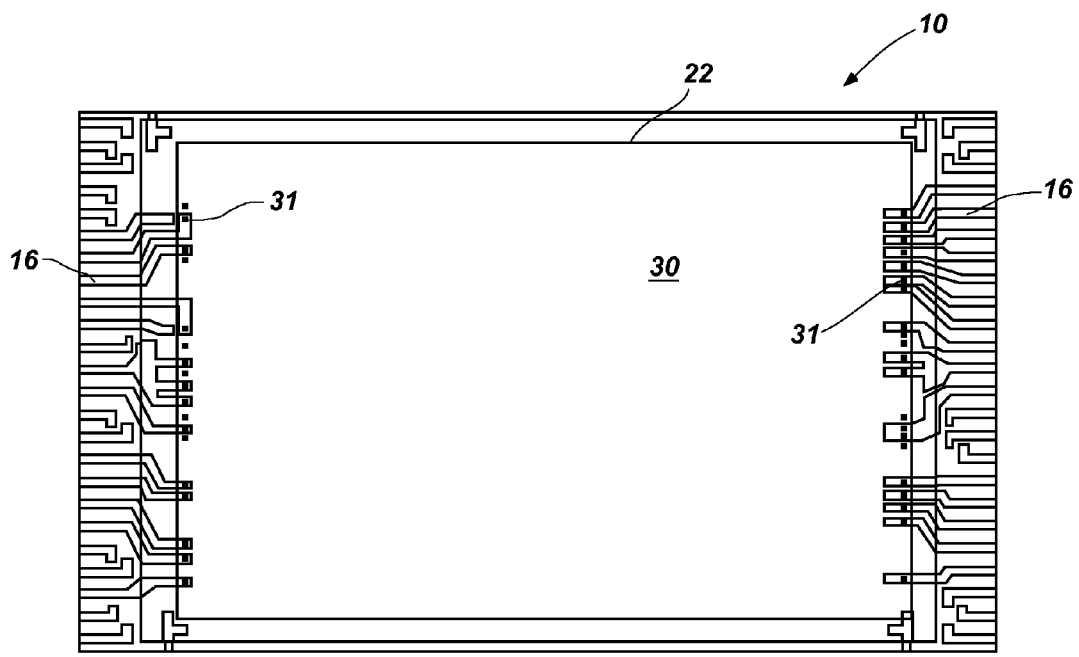
FIG. 5C is a plan view of a pre-encapsulated frame for a semiconductor device having two sides of bond pads on the active surface thereof.

Referring to drawing FIG. 5C, a pre-encapsulated cavity frame 10 is illustrated in a plan view to show the layout of the traces 12 for a 2-sided bond pad configuration for a semiconductor device 30 having bond pads on the active surface thereof located on two sides of the semiconductor device 30. As illustrated the second portions 16 of the traces 12 extend from each side of the pre-encapsulated cavity interposer 10 to extend over bond pads 31 located on the semiconductor die 30. The pre-encapsulated frame 10 is typically used for a semiconductor device 30 such as described in drawing FIG. 4.

Figure 5D:
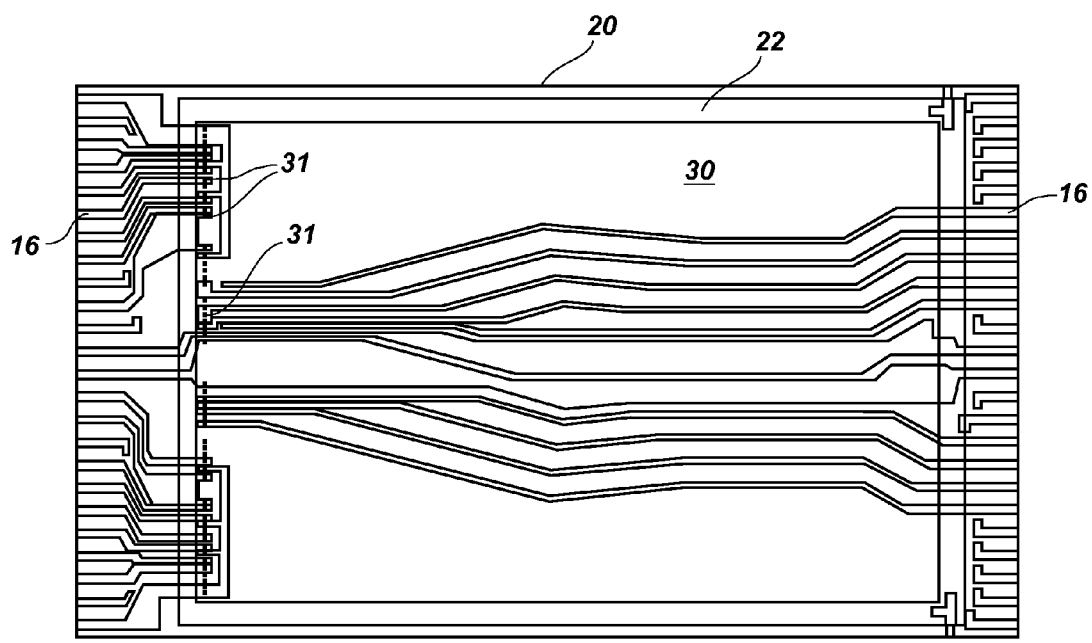
FIG. 5D is a plan view of a pre-encapsulated frame for a semiconductor device having one side of bond pads on the active surface thereof.

Referring to drawing FIG. 5D, a pre-encapsulated cavity frame 10 is illustrated in plan view to show the layout of the traces 12 for a 1-sided bond pad configuration for a semiconductor device 30 having bond pads on the active surface thereof located on one side of the semiconductor device 30. As illustrated the second portions 16 of the traces 12 extend from each side of the pre-encapsulated cavity frame 10 to extend over the bond pads 31 located on the semiconductor die 30. The pre-encapsulated cavity frame 10 is typically used for a semiconductor device 30 such as described in drawing FIG. 5.

Figure 5E:
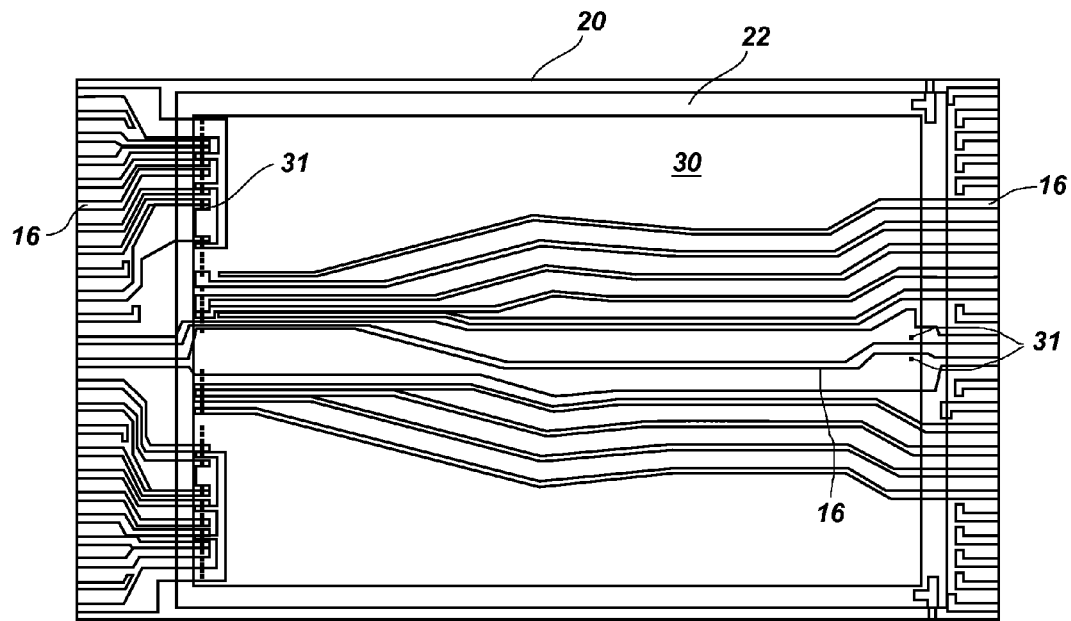
FIG. 5E is a plan view of a pre-encapsulated frame for a semiconductor device having 1.5 sides of bond pads on the active surface thereof.

Referring to drawing FIG. 5E, a pre-encapsulated cavity frame 10 is illustrated in plan view to show the layout of the traces 12 for a 1.5-sided bond pad configuration for a semiconductor device 30 having bond pads on the active surface thereof located on 1.5 sides of the semiconductor device 30. As illustrated the second portions 16 of the traces 12 extend from each side of the pre-encapsulated frame 10 to extend over the bond pads 31 located on the semiconductor die 30. The pre-encapsulated frame 10 is typically used for a semiconductor device 30 such as described in drawing FIG. 5A.

Figure 5F:
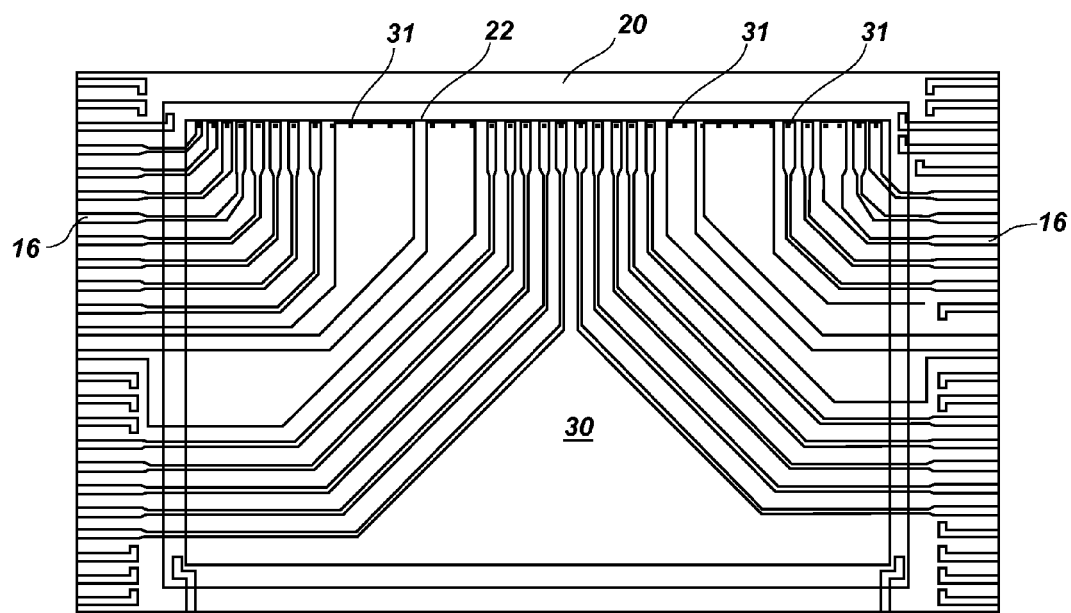
FIG. 5F is a plan view of a pre-encapsulated frame for a semiconductor device having one side of bond pads on the active surface thereof along the long side of the semiconductor device.

Referring to drawing FIG. 5F, a pre-encapsulated frame 10 is illustrated in plan view to show the layout of the traces 12 for a 1-sided bond pad configuration for a semiconductor device 30 having bond pads on the active surface thereof located on a long side of the semiconductor device 30. As illustrated the second portions 16 of the traces 12 extend from each side of the pre-encapsulated cavity interposer 12 to extend over the bond pads 31 located on the semiconductor die 30. The pre-encapsulated frame 10 is typically used for a semiconductor device 30 such as described in drawing FIG. 5B.

Figure 6:
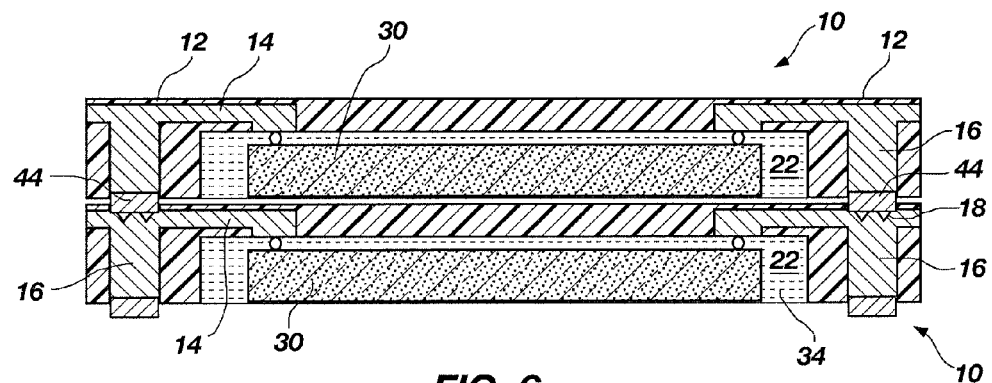
FIG. 6 is a cross-sectional view of two stacked pre-encapsulated frames having semiconductor devices installed therein being interconnected in a DDP arrangement.

Referring to drawing FIG. 6, the pre-encapsulation frame 10 is illustrated in cross section where two pre-encapsulation frames 10 are stacked and connected in DDP form by reflowed solder paste 44 connecting the connecting surfaces 18 of the second portions 16 of the traces 12. The semiconductor devices 30 are attached to the first portions 14 of the traces 12 in a flip-chip style type of arrangement described hereinbefore.

Figure 7:
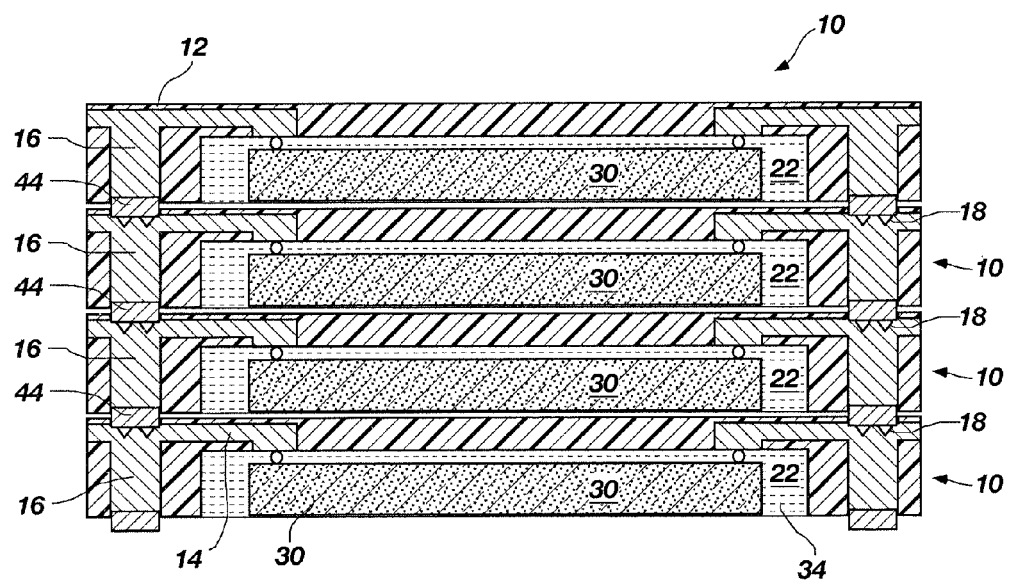
FIG. 7 is a cross-sectional view of four stacked pre-encapsulated frames having semiconductor devices installed therein being interconnected in a QDP arrangement.

Referring to drawing FIG. 7, the pre-encapsulation frame 10 is illustrated in cross section where four pre-encapsulation frames 10 are stacked and connected in QDP form by reflowed solder paste 44 connecting the connecting surfaces 18 of the second portions 16 of the traces 12. The semiconductor devices 30 are attached to the first portions 14 of the traces 12 in a flip-chip style type of arrangement described hereinbefore.

Figure 8:
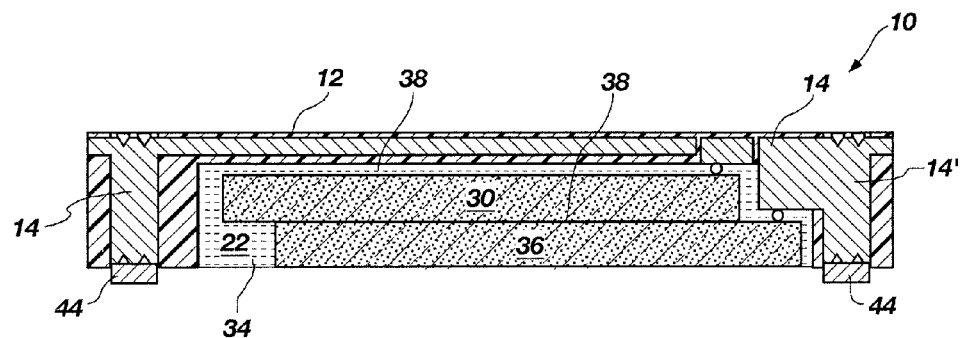
FIG. 8 is a cross-sectional view of a pre-encapsulated frame having two semiconductor devices installed therein in an offset arrangement.

Referring to drawing FIG. 8, the pre-encapsulation frame 10 is illustrated in cross section configured to connect to two semiconductor devices 30 having bond pads on the active surface thereof in a one-sided configuration as known in the art. The traces 12 are formed in a pattern so that a first portion 14 of one trace is longer than the first portion 14 of another trace 12 to connect to a desired bond pad on the semiconductor device 30 in a flip-chip style type of arrangement described hereinbefore. An adhesive 38 may attach the semiconductor device 30 to the encapsulated traces 12 and to each other. The semiconductor devices 30 are stacked having an offset from each other along the side of the semiconductor device 30 having the bond pads located there along. As illustrated, some of the traces 12 are formed having a stepped second portion 14' to attach to bond pads on one side of the lower semiconductor device 30.

Figure 8A:
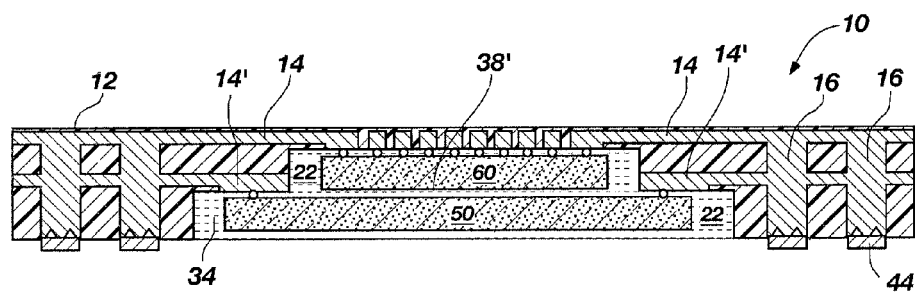
FIG. 8A is a cross-sectional view of a pre-encapsulated frame having two semiconductor devices installed therein in a stacked arrangement.

Referring to drawing FIG. 8A, the pre-encapsulation frame 10 is illustrated in cross section configured to connect to two semiconductor devices, a controller semiconductor device 60 and a NAND semiconductor device 50, each having bond pads on the active surface thereof as described herein as known in the art. The traces 12 are formed in a pattern so that an upper first portion 14 of one trace connects to bond pads of the controller semiconductor device 60 while the lower first portions 14' connect to bond pads on the active surface of a NAND semiconductor device 50 in flip-chip style types of arrangement described hereinbefore. An insulating adhesive or suitable insulating adhesive tape 38' may attach the semiconductor device 60 to the encapsulated traces 12 and to the semiconductor device 50. The semiconductor devices 30 are in a stacked arrangement with the pre-encapsulation frame 10 being thicker to accommodate two semiconductor devices 50 and 60 therein with the cavity 22 being a stepped arrangement to accommodate two semiconductor devices 50 and 60 having different sizes. The cavity 22 is filled and environmentally sealed with a suitable encapsulant material 34.

Figure 9:
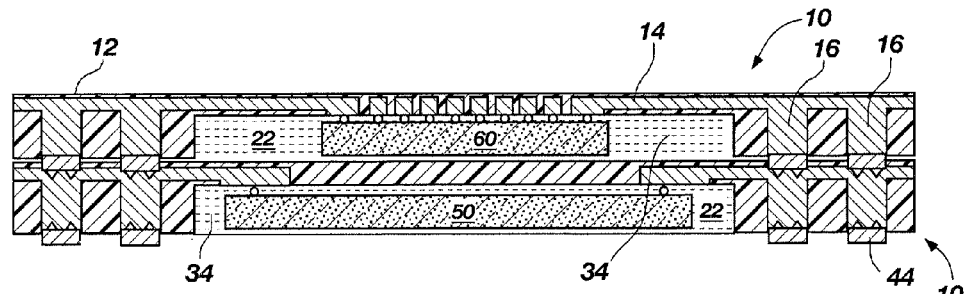
FIG. 9 is a cross-sectional view of two stacked interconnected pre-encapsulated frames, one frame having a DRAM semiconductor memory device installed therein and the other frame having a NAND semiconductor memory device installed therein.

Referring to drawing FIG. 9, the pre-encapsulation frame 10 is illustrated in cross section in a stacked and interconnected configuration for use with a semiconductor device 60, such as a controller semiconductor device known in the art, and another semiconductor device 50, such as a DRAM or NAND Flash memory type semiconductor device, is a stacked configuration. Both of the pre-encapsulation frames 10 have been formed having two second portions 16 for the traces 12. The upper pre-encapsulation frame 10 is formed having the first portions 14 of the traces 12 configured to attach to the bond pads of the semiconductor device 60, which are located solely along one side thereof, such as described in drawing FIG. 5B hereinbefore in a flip-chip style type arrangement. The lower pre-encapsulation frame 10 is formed with the first portions 14 of the traces 12 configured for attachment to the bond pads on the active surface of the semiconductor device 50, which are located along two sides thereof in a flip-chip style type arrangement as described herein.

Figure 10:
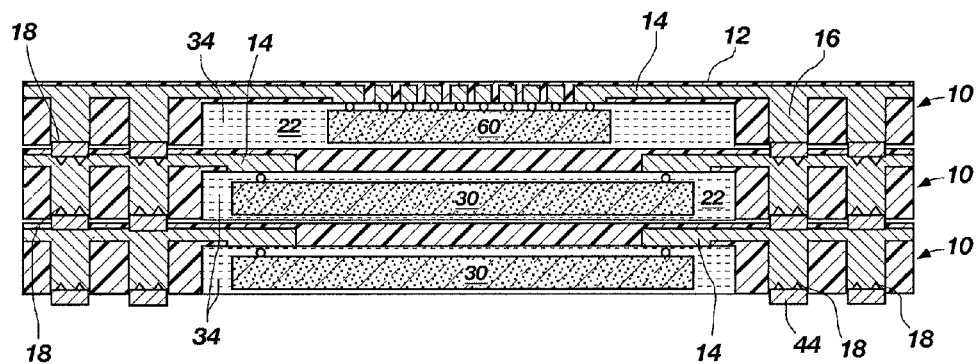
FIG. 10 is a cross-sectional view of three stacked interconnected pre-encapsulated frames, one frame having a controller semiconductor device installed therein and two frames having NAND semiconductor memory devices installed therein.

Referring to drawing FIG. 10, the pre-encapsulation frame 10 is illustrated in cross section in a stacked and interconnected configuration for use with a semiconductor device 60, such as a controller semiconductor device known in the art, and two semiconductor devices 30, such as a NAND Flash memory type semiconductor device. All of the pre-encapsulation frames 10 have been formed having two second portions 16 for the traces 12. The upper pre-encapsulation frame 10 is formed having the first portions 14 of the traces 12 configured to attach to the bond pads of the semiconductor device 30, which are located solely along one side thereof, such as described in drawing FIG. 5B hereinbefore in a flip-chip style type arrangement. The lower pre-encapsulation frames 10 are formed with the first portions 14 of the traces 12 configured for attachment to the bond pads on the active surface of the semiconductor device 50, which are located along two sides thereof in a flip-chip style type arrangement as described herein.

Figure 11:
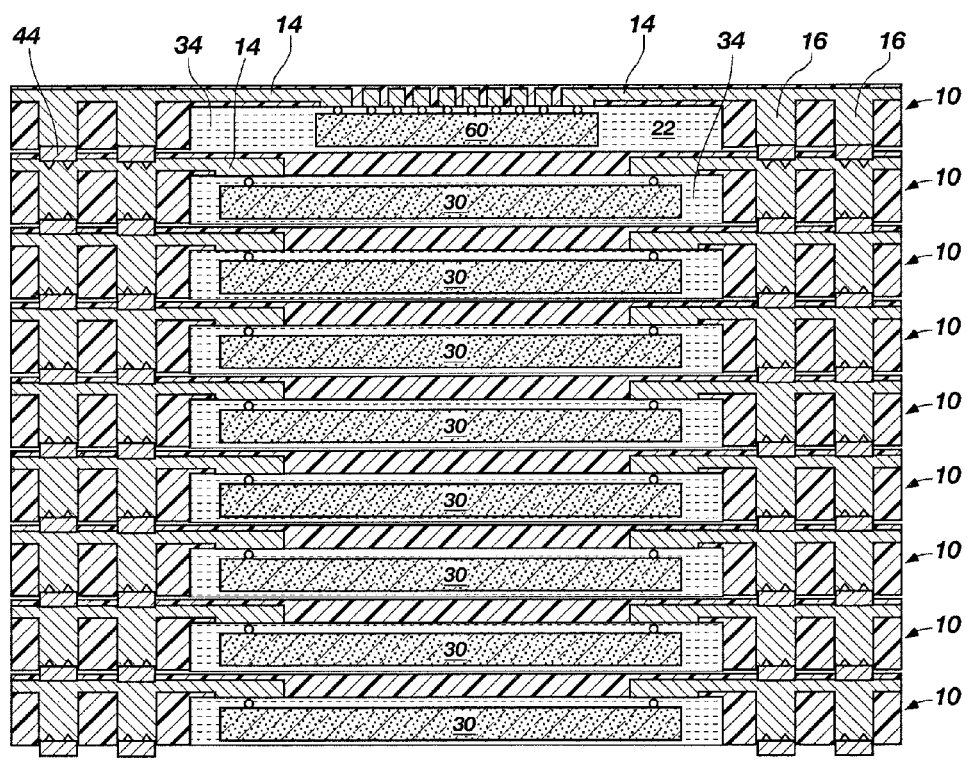
FIG. 11 is a cross-sectional view of nine stacked interconnected pre-encapsulated frames, one frame having a controller semiconductor device installed therein and eight frames having NAND semiconductor memory devices installed therein.

Referring to drawing FIG. 11, the pre-encapsulation frame 10 is illustrated in cross section in a stacked and interconnected configuration for use with semiconductor device 60, such as a controller semiconductor device known in the art, and eight other semiconductor devices 50, such as a NAND Flash memory type semiconductor device, in a stacked configuration. All pre-encapsulation frames 10 have been formed having two second portions 16 for the traces 12. The upper pre-encapsulation frame 10 is formed having the first portions 14 of the traces 12 configured to attach to the bond pads of the semiconductor device 60, which are located solely along one side thereof, such as described in drawing FIG. 5B hereinbefore in a flip-chip style type arrangement. The lower pre-encapsulation frame 10 is formed with the first portions 14 of the traces 12 configured for attachment to the bond pads on the active surface of the semiconductor device 50, which are located along two sides thereof in a flip-chip style type arrangement as described herein.

Figure 12:
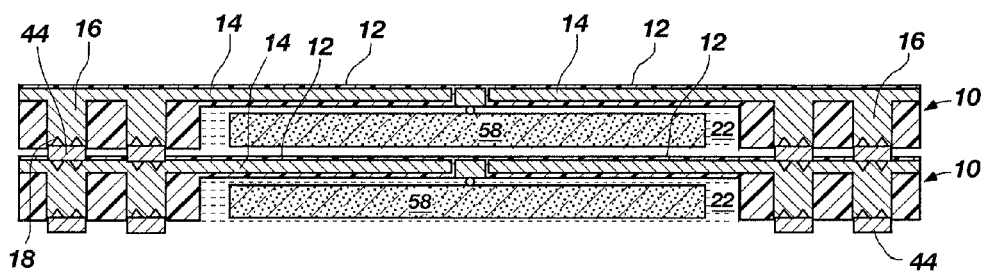
FIG. 12 is a cross-sectional view of two stacked interconnected pre-encapsulated frames, each frame having a semiconductor device having bond pads on the active surface thereof arranged essentially in the center of the active surface essentially in a row.

Referring to drawing FIG. 12, the pre-encapsulation frame 10 is illustrated in cross section in a stacked and interconnected configuration for use with semiconductor devices 50, such as DRAM Flash memory type semiconductor device having the bond pads located on the active surface thereof in essentially a single column in essentially the center of the active surface. Both pre-encapsulation frames 10 have been formed having two second portions 16 for the traces 12. The upper pre-encapsulation frame 10 is formed having the first portions 14 of the traces 12 configured to attach to the bond pads of the semiconductor device 50 hereinbefore in a flip-chip style type arrangement. Each pre-encapsulation frame 10 is connected to the other by reflowed solder paste 44 between the connection areas 18 of the second portions 16 of the traces 12.

Figure 13:
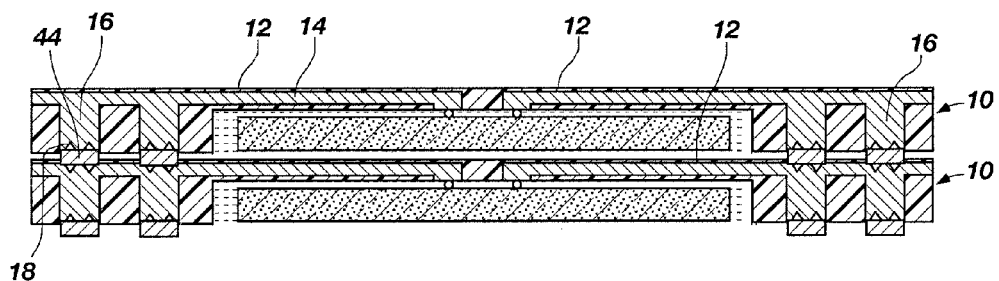
FIG. 13 is a cross-sectional view of two stacked interconnected pre-encapsulated frames, each frame having a semiconductor device having bond pads on the active surface thereof arranged essentially in the center of the active surface essentially in two rows.

Referring to drawing FIG. 13, the pre-encapsulation frame 10 is illustrated in cross section in a stacked and interconnected configuration for use with semiconductor devices 50, such as DRAM Flash memory type semiconductor device, having the bond pads located on the active surface thereof in essentially a two columns in essentially the center portion of the active surface of the semiconductor devices 50. Both pre-encapsulation frames 10 have been formed having two second portions 16 for the traces 12. The upper pre-encapsulation frame 10 is formed having the first portions 14 of the traces 12 configured to attach to the bond pads of the semiconductor device 50 hereinbefore in a flip-chip style type arrangement. Each pre-encapsulation frame 10 is connected to the other by reflowed solder paste 44 between the connection areas 18 of the second portions 16 of the traces 12.

Figure 14:
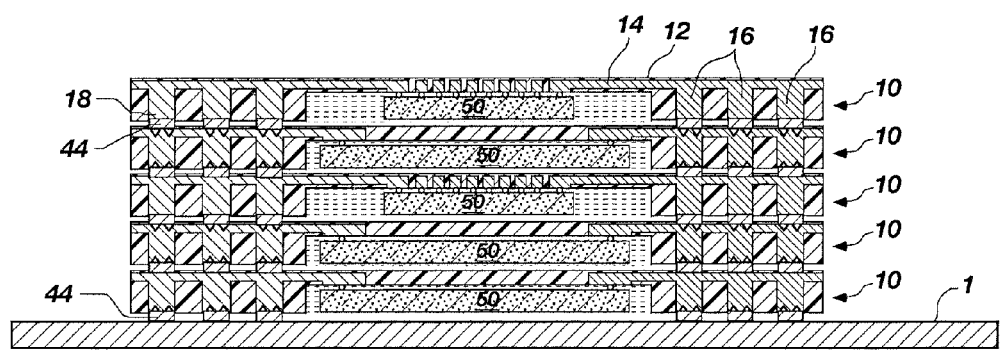
FIG. 14 is a cross-sectional view of five stacked interconnected pre-encapsulated frames located on a substrate, three frames having a NAND semiconductor devices installed therein, one frame having a DRAM semiconductor device installed therein, and one frame having a controller semiconductor device installed therein.

Referring to drawing FIG. 14, the pre-encapsulation frame 10 is illustrated in cross section in a stacked and interconnected configuration for with use for a variety of different types of semiconductor devices 50, 60 having bond pads located on their active surfaces along a number of sides thereof as described hereinbefore with all semiconductor devices 50, 60 connected to circuits on a suitable substrate 1, such as a printed circuit board. All pre-encapsulation frames 10 have been formed having three second portions 16 for the traces 12. The upper pre-encapsulation frame 10 is formed having the first portions 14 of the traces 12 configured to attach to the bond pads of the semiconductor device 50 hereinbefore in a flip-chip style type arrangement. Each pre-encapsulation frame 10 is connected to the other and to the circuits on the substrate 1 by reflowed solder paste 44 between the connection areas 18 of the second portions 16 of the traces 12 and the circuits on the substrate 1.

Figure 15:
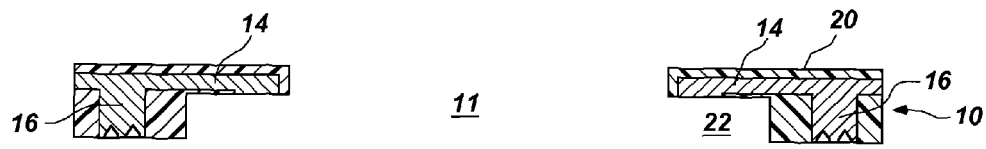
FIG. 15 is a cross-sectional view of a pre-encapsulated frame having an aperture therein.

Referring to drawing FIG. 15, a pre-encapsulation frame 10 is illustrated in cross section in a configuration for use with a CMOS imager semiconductor device (not illustrated). The pre-encapsulation frame 10 includes a central aperture 11 therein.

Figure 15A:
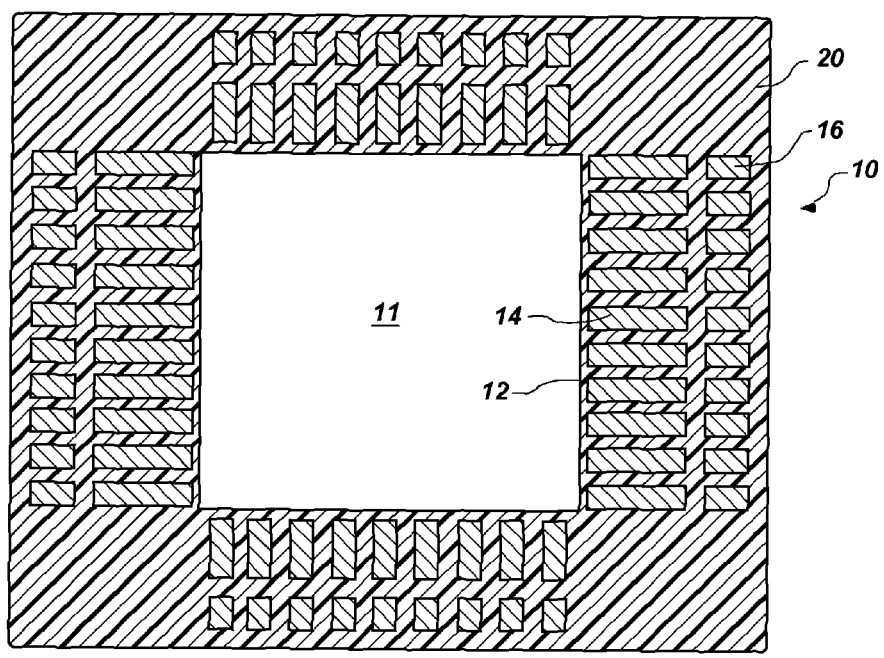
FIG. 15A is a plan view of the pre-encapsulated frame of FIG. 15 from the bottom thereof.

Referring to drawing FIG. 15A, the pre-encapsulation frame 10 illustrated in cross section in FIG. 15 is illustrated in a top view showing the four sides forming the pre-encapsulation frame 10, the central aperture 11, first portion 14 and second portion 16 of traces 12, and encapsulating compound 20.

Figure 15B:
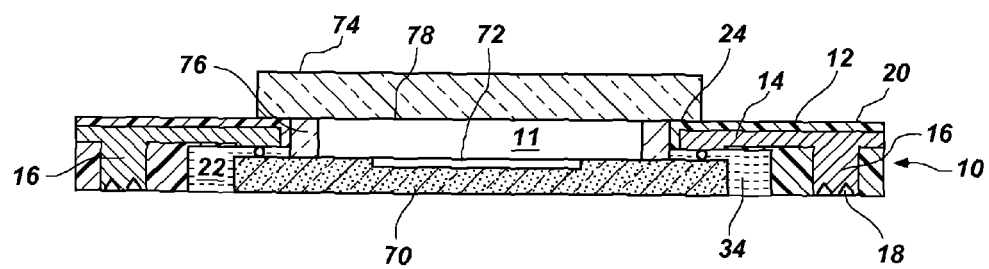
FIG. 15B is a cross-sectional view of the pre-encapsulated frame of FIG. 15 having an imaging type semiconductor device installed therein and a lens installed therewith.

Referring to drawing FIG. 15B, the pre-encapsulation frame 10 is illustrated in cross section having a CMOS imager semiconductor device 70 having an imaging area 72 connected in a flip-chip style to using gold to solder bumps to the first portion 14 of the traces 12 and having a glass 74, a transparent member, located over central aperture 11 contacting the upper surface 24 of the encapsulating compound 20 and attached to the CMOS imager semiconductor device 70 by adhesive members 76 extending from a lower surface 78 of the glass 74, through the aperture 11, and attached to the CMOS imager semiconductor device 70.

Figure 15C:
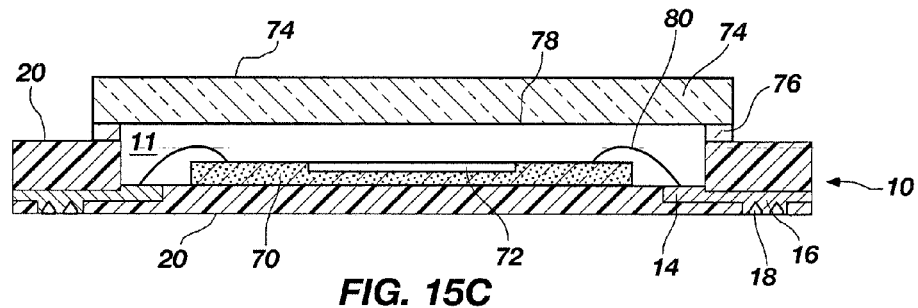
FIG. 15C is a cross-sectional view of a pre-encapsulated frame having an imaging type semiconductor device installed therein using bond wire type electrical connections and having a lens installed therewith.

Referring to drawing FIG. 15C, the pre-encapsulation frame 10 is illustrated in cross section having a CMOS imager semiconductor device 70 attached to encapsulating compound 20 using a suitable adhesive with the CMOS imager semiconductor device 70 connected to first portions 14 of the traces 12 using bond wires. The glass 74 is located over aperture 11 having the adhesive members 76 attaching the glass to the encapsulating compound 20. The second portions 16 of traces 12 are formed having connection areas 18.

Figure 15D:
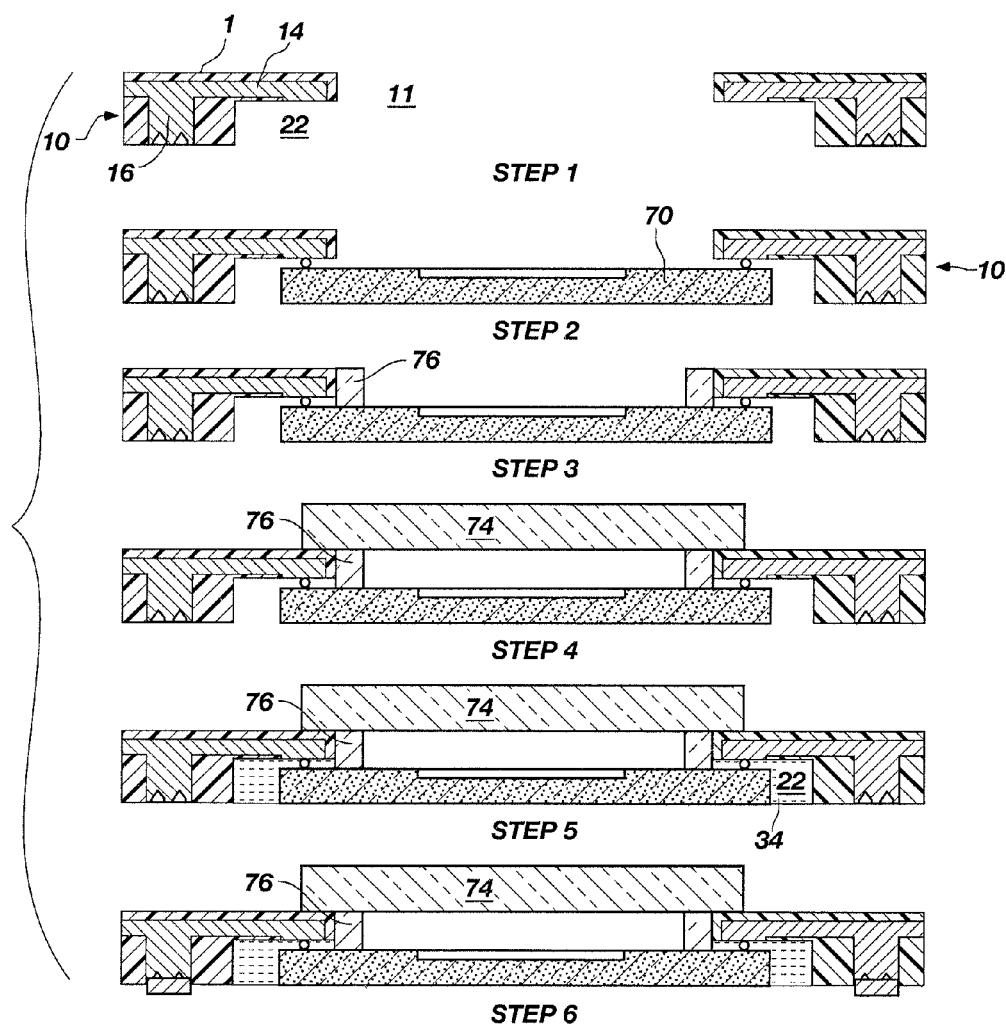
FIG. 15D is a view of the process for installing an imaging type semiconductor device in the pre-encapsulated frame.

Referring to drawing FIG. 15D, the pre-encapsulation frame 10 is illustrated in cross section, as in drawing FIG. 15 and top view in drawing FIG. 15A, for the first step in the forming of the CMOS imager semiconductor device 70 attachment thereto in a flip-chip style. In step 2, the CMOS imager semiconductor device 70 is attached to the first portions 14 of the traces 12 using gold to reflowed solder ball or bump type attachment in a flip-chip type style. In step 3, the members 76 are attached to the CMOS imager semiconductor device 70 using a suitable type adhesive. In step 4, the glass 74 is attached to the members 74 using a suitable adhesive. In step 5, a suitable encapsulant 34 is used to fill the cavity 22 to seal the CMOS imager semiconductor device 70 in the pre-encapsulation frame 10. In step 6, solder paste 44 is applied to contact areas 18 of the second portion 16 of the traces 12 for connection of the CMOS imager semiconductor device 70 to a camera chip module (not shown). This process may also be used for a CMOS imager semiconductor device 70 having connections to the first portions 14 of the traces 12 using bond wires has described herein with respect to drawing FIG. 15C.

Figure 16:
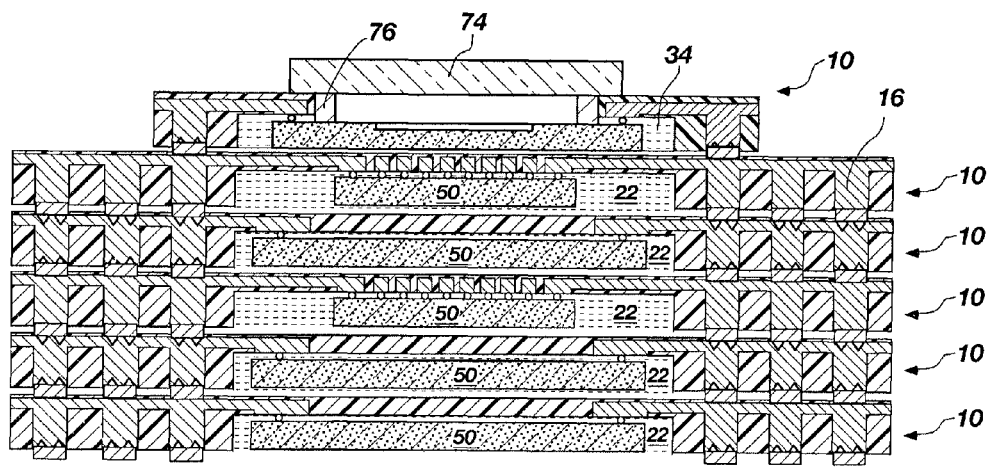
FIG. 16 is a cross-sectional view of six stacked interconnected pre-encapsulated frames, one frame having an imaging semiconductor device installed therein and a lens installed therewith, three frames having NAND semiconductor devices installed therein, one frame having a DRAM semiconductor device installed therein, and one frame having a controller semiconductor device installed therein.

Referring to drawing FIG. 16, the pre-encapsulation frame 10 is illustrated in cross section as shown in drawing FIG. 15C having a CMOS imager semiconductor device 70 attached thereto and a series of pre-encapsulation frames 10 having various semiconductor devices attached thereto in a stacked configuration as illustrated in drawing FIG. 14.

Figure 17:
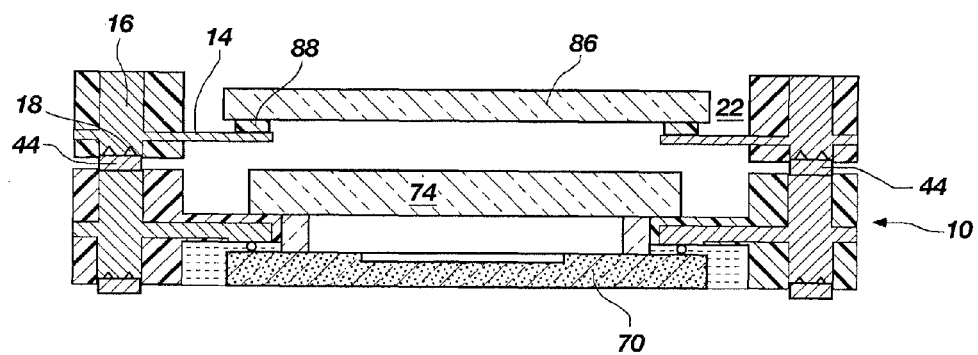
FIG. 17 is a cross-sectional view of two stacked and interconnected pre-encapsulated frames, one frame having an imaging type semiconductor device installed therein and a lens installed therewith and one frame having a lens installed therewith.

Referring to drawing FIG. 17, the pre-encapsulation frame 10 is illustrated in cross section as shown in drawing FIG. 15C having a CMOS imager semiconductor device 70 attached thereto and an additional pre-encapsulation frame 10 having a additional lens 86 attached to first portions 14 of traces 12 by a suitable adhesive 88 in cavity 22 of the pre-encapsulation frame 10. The second portions 16 of the traces 12 are connected using solder paste 44 at the connection areas 18 of the second portions 16. As many additional lenses 86 may be attached to pre-encapsulation frames 10 and stacked on a preceding pre-encapsulation frame 10 having a lens 86 installed therein.

Figure 18:
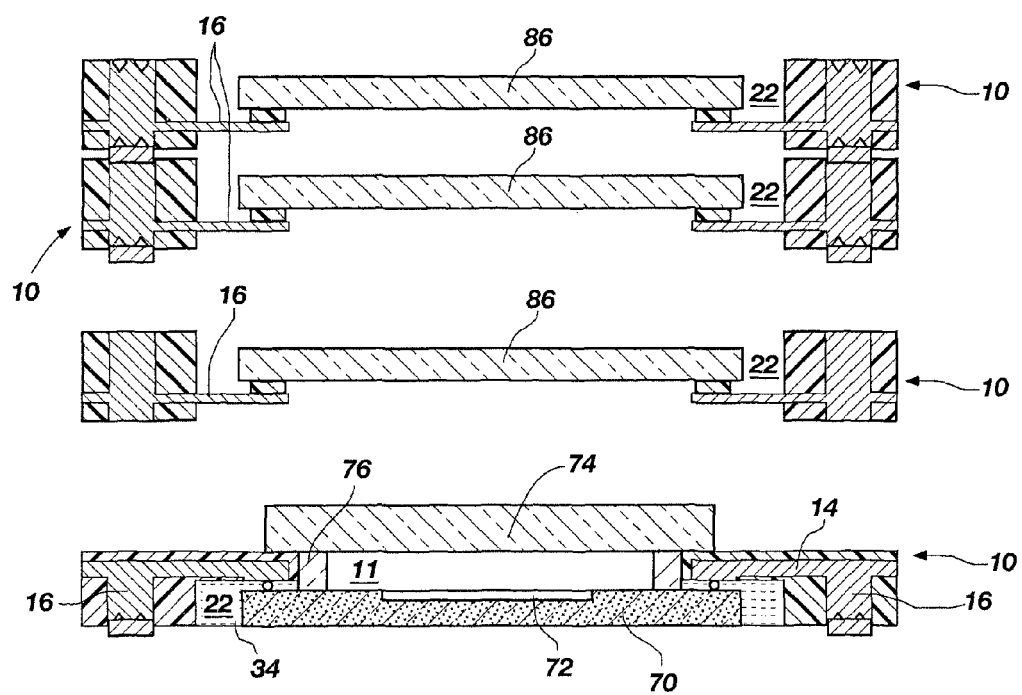
FIG. 18 is a cross-sectional view of four pre-encapsulated frames, one frame having an imaging semiconductor device installed therein and a lens therewith and three frames having lens installed therewith.

Referring to drawing FIG. 18, a pre-encapsulation frame 10 is illustrated in cross section as shown in drawing FIG. 15C having a CMOS imager 70 attached thereto and an additional pre-encapsulation frames 10 having an additional lens 86 attached to first portions 14 of traces 12 by a suitable adhesive 88 in cavity 22 of the pre-encapsulation frame 10. The second portions 16 of the traces 12 are connected using solder paste 44 at the connection areas 18 of the second portions 16. As many additional lenses 86 may be attached to pre-encapsulation frames 10 and stacked on a preceding pre-encapsulation frame 10 having a lens 86 installed therein. As illustrated, the additional two lenses 86 are used for an optical zoom effect for a camera module (not shown).

Having described the inventions of the pre-encapsulated interposer frame, it will be apparent to one of ordinary skill in the art that changes and modifications may be made thereto, such as the addition of vertical molded guides in the cavity of the pre-encapsulated interposer frame to guide a semiconductor device in position in the cavity, using a pre-capsulated interposer frame to house three or more semiconductor devices, the use of four or more second portions of the traces connected to first portions of the traces to connect to a semiconductor device, etc. Such changes or modifications are intended to be covered by the claimed inventions.

What is claimed is:

1. A method of assembling a pre-encapsulated assembly comprising:
   attaching an imaging semiconductor device to a first encapsulated structure having a cavity therein, the cavity having a portion of the first encapsulated structure extending thereover, another portion extending therearound, an aperture in the top thereof and a plurality of traces located in the first encapsulated structure, each trace having a first portion extending in the portion of the first encapsulated structure extending over the cavity and a second portion extending in the another portion of the encapsulated member connected to the first portion, one end of the second portion being exposed for connection thereto;
   dispensing an adhesive contacting a portion of the first encapsulated structure and a portion of the imaging semiconductor device;
   attaching a transparent member to the first encapsulated structure by contacting the adhesive;
   sealing the cavity in the encapsulated member using a liquid encapsulant material; and
   placing solder material on the first encapsulated structure in a pattern on the second portions of at least some traces.

2. The method of claim 1, further comprising connecting the second portion of at least one trace of the plurality of traces to a connection area of second encapsulated structure to electrically connect the imaging semiconductor device to at least one of a DRAM and a NAND Flash memory semiconductor device.

3. A method of forming a pre-encapsulated frame, comprising:
   flowing a dielectric encapsulating compound around at least one conductive trace;
   controlling flow of the dielectric encapsulating compound to form a cavity configured to receive at least one semiconductor device at least partially in the cavity in the encapsulation material;
   controlling flow of the dielectric encapsulating compound to leave exposed a first connection area of the at least one trace at a first depth within the cavity for connection to a first semiconductor device;
   controlling flow of the dielectric encapsulating compound to leave exposed a second connection area of the at least one trace at a second, different depth within the cavity for connection to a second semiconductor device;
   controlling flow of the dielectric encapsulating compound to leave exposed at least another connection area of the at least one trace laterally adjacent to the cavity; and
   hardening the dielectric encapsulating compound to form a pre-encapsulated frame.

4. The method of claim 3, wherein controlling flow of the dielectric encapsulating compound to leave exposed the first connection area of the at least one trace within the cavity comprises controlling flow of the dielectric encapsulating compound to leave exposed a plurality of first connection areas of a plurality of traces within the cavity.

5. The method of claim 4, wherein controlling flow of the dielectric encapsulating compound to leave exposed the plurality of first connection areas of the plurality of traces within the cavity comprises:
   controlling flow of the dielectric encapsulating compound to leave exposed at least one first connection area of the plurality of first connection areas associated with a first trace of the plurality of traces at the first depth within the cavity for connection to a first semiconductor device; and
   controlling flow of the dielectric encapsulating compound to leave exposed at least another first connection area of the plurality of first connection areas associated with another trace of the plurality of traces at a third, different depth within the cavity for connection to the second semiconductor device.

6. The method of claim 3, further comprising forming a central aperture configured to transmit light to an imaging semiconductor device above the cavity.

7. A method of forming a semiconductor device package, comprising:
   flowing a dielectric encapsulation material around a plurality of conductive traces;
   controlling flow of the dielectric encapsulation material to form a cavity configured to receive at least one semiconductor device at least partially in the cavity in the encapsulation material;
   controlling flow of the dielectric encapsulation material to leave exposed a plurality of first connection areas of the plurality of traces within the cavity, wherein at least one first connection area of the plurality of first connection areas of a first trace of the plurality of traces is exposed at a first depth within the cavity for connection to a first semiconductor device and at least another first connection area of the plurality of first connection areas of another trace of the plurality of traces is exposed at a second, different depth within the cavity for connection to a second semiconductor device;
   controlling flow of the dielectric encapsulation material to leave exposed at least another connection area of the first trace laterally adjacent to the cavity;
   hardening the dielectric encapsulation material to a pre-encapsulated frame;
   disposing at least one semiconductor device at least partially in the cavity with an active surface of the at least one semiconductor device facing the at least one first connection area of the first trace; and
   connecting the at least one first connection area of the first trace to the active surface of the at least one semiconductor device.

8. The method of claim 7, further comprising connecting the at least another first connection area to a second semiconductor device.

9. The method of claim 7, further comprising:
exposing a third connection area of the first trace at a third, different depth within the cavity for connection to a second semiconductor device.

10. The method of claim 9, further comprising connecting the third connection area to a second semiconductor device.

11. The method of claim 7, further comprising forming a central aperture above the cavity to transmit light to the semiconductor device, wherein the semiconductor device comprises an imaging semiconductor device.

12. The method of claim 7, further comprising connecting a plurality of first connection areas of a plurality of first traces to the active surface of the at least one semiconductor device along one side of the at least one semiconductor device.

13. The method of claim 12, wherein connecting the plurality of first connection areas of the plurality of first traces to the active surface of the at least one semiconductor device along the one side of the at least one semiconductor device comprises connecting the plurality of first connection areas to the active surface of the at least one semiconductor device along a long side of the at least one semiconductor device.

14. The method of claim 7, further comprising connecting a plurality of first connection areas of a plurality of first traces to bond pads on the active surface of the at least one semiconductor device in a 1.5-sided configuration.

15. The method of claim 7, further comprising connecting a plurality of first connection areas of a plurality of first traces to bond pads on the active surface of the at least one semiconductor device in a 2-sided configuration.

16. The method of claim 7, further comprising flowing an encapsulant material into the cavity with the semiconductor device.

17. The method of claim 7, further comprising connecting the at least another connection area of the at least one trace to a connection area of at least a second pre-encapsulated frame stacked with the pre-encapsulated frame.

* * * * *

UNITED STATES PATENT AND TRADEMARK OFFICE
CERTIFICATE OF CORRECTION

PATENT NO. : 8,399,297 B2
APPLICATION NO. : 13/277988
DATED : March 19, 2013
INVENTOR(S) : Tay Wuu Yean et al.

It is certified that error appears in the above-identified patent and that said Letters Patent is hereby corrected as shown below:

In the Claims

In column 14, line 59, in Claim 7, after "to" insert -- form --.

Signed and Sealed this
Twenty-eighth Day of May, 2013

Teresa Stanek Rea
*Acting Director of the United States Patent and Trademark Office*